United States Patent
Perrott et al.

(10) Patent No.: US 6,765,445 B2
(45) Date of Patent: Jul. 20, 2004

(54) DIGITALLY-SYNTHESIZED LOOP FILTER CIRCUIT PARTICULARLY USEFUL FOR A PHASE LOCKED LOOP

(75) Inventors: Michael H. Perrott, Cambridge, MA (US); Rex T. Baird, Nashua, TX (US); Yunteng Huang, Irvine, CA (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 10/656,425

(22) Filed: Sep. 5, 2003

(65) Prior Publication Data

US 2004/0051590 A1 Mar. 18, 2004

Related U.S. Application Data

(62) Division of application No. 09/902,541, filed on Jul. 10, 2001, now Pat. No. 6,630,868.
(60) Provisional application No. 60/217,207, filed on Jul. 10, 2000, and provisional application No. 60/217,208, filed on Jul. 10, 2000.

(51) Int. Cl.[7] ................................................. H03B 5/24
(52) U.S. Cl. ............................. 331/17; 331/11; 331/16; 331/18; 331/25; 375/376; 375/247
(58) Field of Search ....................... 331/17, 11, 16, 331/18, 25; 375/376, 247

(56) References Cited

U.S. PATENT DOCUMENTS

| | | |
|---|---|---|
| 3,968,493 A | 7/1976 | Last et al. |
| 4,237,423 A | 12/1980 | Rhodes |
| 4,371,974 A | 2/1983 | Dugan |
| 5,005,016 A | 4/1991 | Schmidt et al. |
| 5,027,085 A | 6/1991 | DeVito |

(List continued on next page.)

FOREIGN PATENT DOCUMENTS

| | | |
|---|---|---|
| EP | 0590323 A1 | 4/1994 |
| JP | 62-81813 | 4/1987 |

OTHER PUBLICATIONS

Andersson, L. I. et al, "Silicon Bipolar Chipset for SONET/SDH 10Gb/s Fiber–Optic Communication Links," IEEE Journal of Solid–State Circuits, vol. 30, No. 3, Mar. 1995, pp. 210–218.

(List continued on next page.)

*Primary Examiner*—Michael Tokar
*Assistant Examiner*—Lam T Mai
(74) *Attorney, Agent, or Firm*—Zagorin, O'Brien & Graham LLP

(57) ABSTRACT

In a feedback system such as a PLL, the integrating function associated with a loop filter capacitor is instead implemented digitally and is easily implemented on the same integrated circuit die as the PLL. There is no need for either an external loop filter capacitor nor for a large loop filter capacitor to be integrated on the same integrated circuit die as the PLL. In a preferred embodiment, an analog phase detector is utilized whose phase error output signal is delta-sigma modulated to encode the magnitude of the phase error using a digital (i.e., discrete-time and discrete-value) signal. This digital phase error signal is "integrated" by a digital integration block including, for example, a digital accumulator, whose output is then converted to an analog signal, optionally combined with a loop feed-forward signal, and then conveyed as a control voltage to the voltage-controlled oscillator. The equivalent "size" of the integrating capacitor function provided by the digital integration block may be varied by increasing or decreasing the bit resolution of circuits within the digital block. Consequently, an increasingly larger equivalent capacitor may be implemented by adding additional digital stages, each of which requires a small incremental integrated circuit area. The power dissipation of the digital integration block is reduced by incorporating a decimation stage to reduce the required operating frequency of the remainder of the digital integration block.

28 Claims, 19 Drawing Sheets

U.S. PATENT DOCUMENTS

| | | | |
|---|---|---|---|
| 5,036,294 A | | 7/1991 | McCaslin |
| 5,036,298 A | | 7/1991 | Bulzachelli |
| 5,239,561 A | | 8/1993 | Wong et al. |
| 5,373,255 A | | 12/1994 | Bray et al. |
| 5,495,512 A | | 2/1996 | Kovacs et al. |
| 5,559,841 A | | 9/1996 | Pandula |
| 5,631,933 A | * | 5/1997 | Chu et al. ................. 375/376 |
| 5,734,008 A | * | 3/1998 | Shirasaki et al. ........... 528/353 |
| 5,774,023 A | * | 6/1998 | Irwin ........................... 331/17 |
| 5,870,003 A | * | 2/1999 | Boerstler ..................... 331/17 |
| 5,892,407 A | * | 4/1999 | Ishii ............................ 331/17 |
| 5,942,949 A | | 8/1999 | Wilson et al. |
| 5,977,838 A | * | 11/1999 | Nagoya et al. ............... 331/17 |
| 5,978,426 A | * | 11/1999 | Glover et al. ............... 375/376 |
| 5,986,512 A | * | 11/1999 | Eriksson ...................... 331/16 |
| 6,008,703 A | | 12/1999 | Perrott et al. |
| 6,011,815 A | * | 1/2000 | Eriksson et al. ............ 375/376 |
| 6,047,029 A | * | 4/2000 | Eriksson et al. ............ 375/247 |
| 6,075,388 A | | 6/2000 | Dalmia |
| 6,075,416 A | | 6/2000 | Dalmia |
| 6,125,158 A | | 9/2000 | Carson et al. |
| 6,137,372 A | | 10/2000 | Welland et al. |
| 6,147,567 A | | 11/2000 | Welland et al. |
| 6,150,891 A | | 11/2000 | Welland et al. |
| 6,151,152 A | | 11/2000 | Neary |
| 6,167,245 A | | 12/2000 | Welland et al. |
| 6,208,211 B1 | | 3/2001 | Zipper et al. |
| 6,580,376 B2 | | 6/2003 | Perrott |
| 6,590,426 B2 | | 7/2003 | Perrott |
| 6,643,346 B1 | * | 11/2003 | Pedrotti et al. ............... 331/17 |
| 6,683,506 B2 | * | 1/2004 | Ye et al. ....................... 331/18 |
| 6,686,805 B2 | * | 2/2004 | Cyrusian ...................... 331/25 |

OTHER PUBLICATIONS

Belot, D. et al., "A 3.3–V Power Adaptive 1244/622/155 Mbit/s Transceiver for ATM, SONET/SDH," IEEE Journal of Solid–State Circuits, vol. 33, No. 7, Jul. 1998, pp. 1047–1058.

Gray, C. T. et al., "A Sampling Technique and Its CMOS Implementation with 1 Gb/s Bandwidth and 25 ps Resolution," IEEE Journal of Solid–State Circuits, vol. 29, No. 3, Mar. 1994, pp. 340–349.

Guiterrez G. et al, "2.488 Gb/s Silicon Bipolar Clock and Data Recovery IC for SONET (OC–48)," IEEE 1998 Custom Integrated Circuits Conference, pp. 575–578.

Guiterrez, G. and Kong, S., "Unaided 2.5 Gb/s Silicon Bipolar Clock and Data Recovery IC," VIII–7, 1998 IEEE Radio Frequency Integrated Circuits Symposium, pp. 173–176.

Hogge, Charles R., Jr., "A Self Correcting Clock Recovery Circuit," IEEE Journal of Lightwave Technology, vol. LT–3, Dec. 1985, pp. 1312–1314, re–printed as pp. 249–251.

Hu, T. H. and Gray, P. R., "A Monolithic 480 Mb/s Parallel AGC/Decision/Clock–Recovery Circuit in 1.2–$\mu$m CMOS," IEEE Journal of Solid–State Circuits, vol. 28, No. 12, Dec. 1993, pp. 1314–1320.

Jarman, David, "A Brief Introduction to Sigma Delta Conversion," Application Note AN9504, Intersil Corporation, May 1995, pp. 1–7.

Kawai, K. et al., "A 557–mW, 2.5–Gbit/s SONET/SDH Regenerator–Section Terminating LSI Chip Using Low–Power Bipolar–LSI Design," IEEE Journal of Solid–State Circuits, vol. 34, No. 1, Jan. 1999, pp. 12–17.

Lee, T. H. and Bulzacchelli, J. F., "A 155–MHz Clock Recovery Delay– and Phase–Locked Loop," IEEE Journal of Solid–State Circuits, vol. SC–27, Dec. 1992, pp. 1736–1746, re–printed as pp. 421–430.

Lee, T. H. et al., "A 2.5 V CMOS Delay–Locked Loop for an 18 Mbit, 500 Megabyte/s DRAM," IEEE Journal of Solid–State Circuits, vol. 29, No. 12, Dec. 1994, pp. 1491–1496.

Perrott, M. et al., "A 27mW CMOS Fractional–N Synthesizer/Modulator IC," 1997 IEEE International Solid–State Circuits Conference, Session 22, Communications Building Blocks II, Paper SP 22.2, 1997 Digest of Technical Papers, vol. 40, pp. 366–367, 487.

Perrott, M. et al., "A 27mW CMOS Fractional–N Synthesizer Using Digital Compensation for 2.5–Mb/s GFSK Modulation," IEEE Journal of Solid–States Circuits, vol. 32, No. 12, Dec. 1997, pp. 2048–2060.

Pottbacker, A. et al., "A Si Bipolar Phase and Frequency Detector IC for Clock Extrraction up to 8 Gb/s," IEEE Journal of Solid–State Circuits, vol. 27, No. 12, Dec. 1992, pp. 1747–1751.

Razavi, Behzad, "Design of Monolithic Phase–Locked Loops and Clock Recovery Circuits—A Tutorial," Monolithic Phase–Locked Loops and Clock Recovery Circuits—Theory and Design, ed. B. Razavi, IEEE Press, N.Y., 1996, pp. 1–39.

Walker, R. C. et al., "A 10Gb/s Si–Bipolar TX/RX Chipset for Computer Data Transmission," IEEE International Solid–State Circuits Conference, Session 19, Paper 19.1 Slide Supplement, 1998, pp. 19.1–1–19.1–11.

Walker, R. C. et al., "A 1.5 Gb/s Link Interface Chipset for Computer Data Transmission," IEEE Journal on Selected Areas in Communications, vol. 9, No. 5, Jun. 1991, pp. 698–703.

Weston, H. T. et al., "A Submicrometer NMOS Multiplexer–Demultiplexer Chip Set for 622.08–Mb/s SONET Applications," IEEE Journal of Solid–State Circuits, vol. 27, No. 7, Jul. 1992, pp. 1041–1049.

Willingham, S. et al., "An Integrated 2.5GHz $\Sigma\Delta$ Frequency Synthesizer with 5 $\mu$s Settling and 2Mb/s Closed Loop Modulation," 2000 IEEE International Solid–State Circuits Conference, Session 12, Paper TP 12.3, pp. 200–201, 457.

Masaru Kokubo et al, "FA 15.2: A Fast–Frequency–Switching PLL Synthesizer LSI with a Numerical Phase Comparator," IEEE International Solid–State Circuits Conference, New York, vol. 38, Feb. 1, 1995, pp. 260–261, 376.

Shayan, Y. R. et al., "All Digital Phase–Locked Loop: Concepts, Design and Applications," IEEE Proceedings–F/ Radar and Signal Processing 136, Stevenage, Herts, GB, vol. 136, No. 1, Part F, Feb. 1, 1989, pp. 53–56.

* cited by examiner

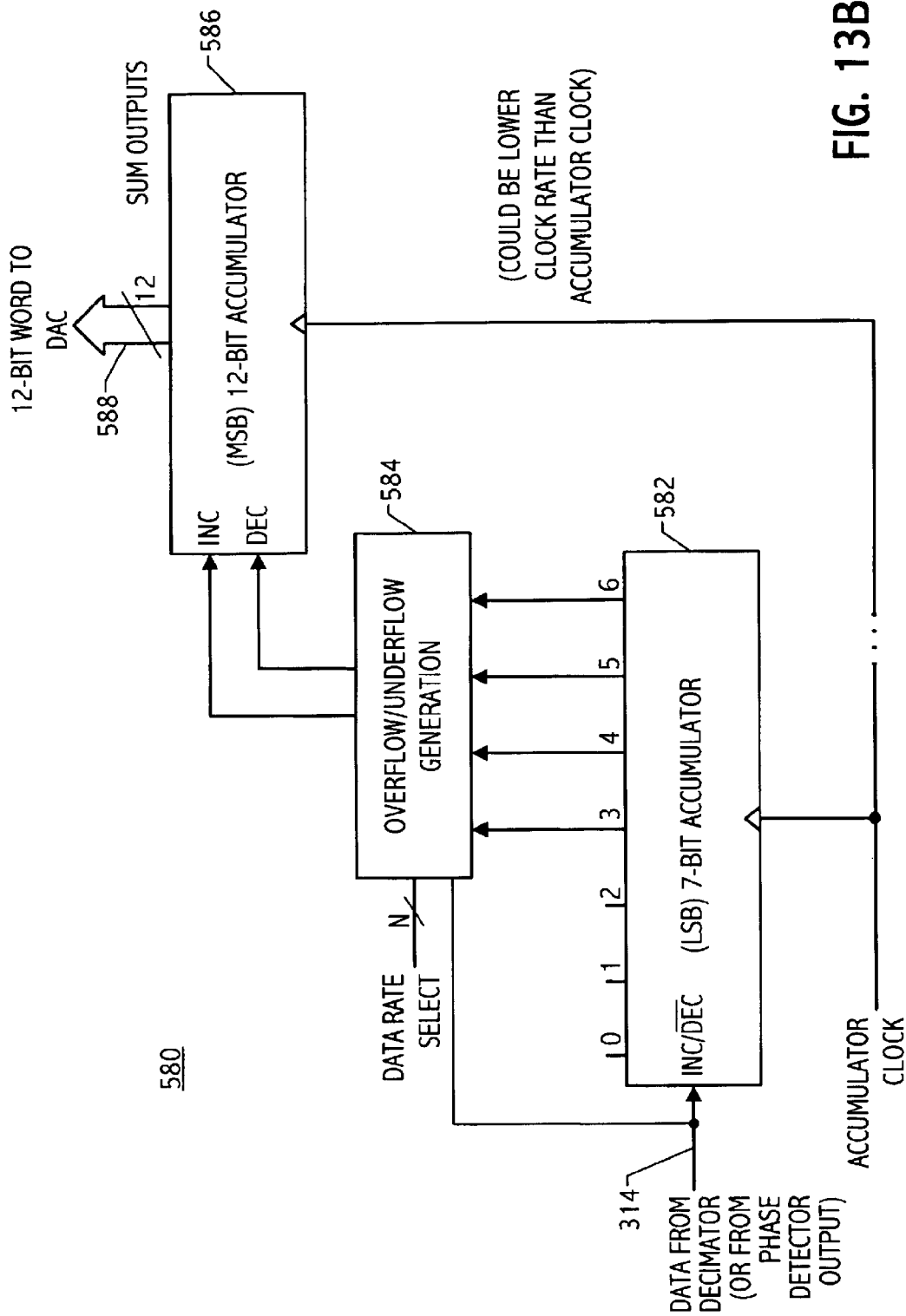

DIGITALLY-SYNTHESIZED LOOP FILTER CIRCUIT PARTICULARLY USEFUL FOR A PHASE LOCKED LOOP

CROSS-REFERENCE TO RELATED APPLICATION(S)

This application is a Divisional application of U.S. Application No. 09/902,541 filed on Jul. 10, 2001, now U.S. Pat. No. 6,630,868, entitled "Digitally-Synthesized Loop Filter Circuit Particularly Useful For A Phase Locked Loop," which application claims the benefit of U.S. Provisional Application No. 60/217,207, filed Jul. 10, 2000, and U.S. Provisional Application No. 60/217,208, filed Jul. 10, 2000. Each of these three applications is hereby incorporated by reference.

BACKGROUND OF THE INVENTION

1. Field of the Invention

The present invention relates to feedback systems, and particularly to those circuits useful for implementing a phase locked loop, and more particularly to clock and data recovery circuits.

2. Description of Problem to be Solved and Related Art

Phase locked loops (PLLs) have been known and studied for quite some time. Initially they were very expensive to implement, and found use in only the most technically-demanding and/or cost-insensitive applications. However, as the cost of integrated circuit technology has decreased over the years, and as the performance capability of such integrated circuit technology has increased, today PLLs are extremely inexpensive to implement and are found in wide use in many applications.

A generalized block diagram of a traditional PLL is shown in FIG. 1 which is configured for a clock and data recovery application. The phase locked loop 100 includes a phase/frequency detector 102 which receives the input data signal conveyed on node 112 and the output clock signal of the voltage controlled oscillator (VCO) 110 conveyed on node 124. The phase/frequency detector 102 generates on its output node 116 an error signal which is a function of the phase difference between the input data signal and the VCO clock, and may also include additional circuitry to generate on an output node 114 the reconstructed data, as shown.

A gain block 104, an integrator block 106, and a summer block 108 together form a filter block which low-pass filters the output of the phase/frequency detector 102 to generate a control signal on node 122 which is provided to the voltage controlled oscillator 110 in order to influence the frequency (and hence the phase) of the VCO output signal. The integrator block 106 is often implemented using a charge pump and a loop filter capacitor, as is well known in the art. Such loop filter capacitors are usually required to be very large for the PLL to exhibit acceptable peaking behavior in its frequency response.

In order to appreciate this issue, a brief description of the frequency response of this traditional PLL is warranted. The closed loop transfer function, G(s), of this traditional PLL 100 is set forth in Equation 1:

$$G(s) = \frac{\frac{K'}{\omega_z}(s + \omega_z)}{S^2 + \frac{K'}{\omega_z}s + K'} \quad \text{(Eq. 1)}$$

where K' and $\omega_z$ are determined by the settings of various PLL parameters. In the traditional PLL 100, the value of $\omega_z$ is given by Equation 2.

$$\omega_z = \frac{I}{CK} \quad \text{(Eq. 2)}$$

where I corresponds to the magnitude of the current of the charge pump, C corresponds to the magnitude of the loop filter capacitor, and K corresponds to the gain of the gain block 104. A graph of the frequency response of this closed loop transfer function G(s) is shown in FIG. 2 by curve 130. As shown in this graph, the magnitude of the transfer function is fairly constant at low frequency, and increases slightly for frequencies between $\omega_z$ and $\omega_{BW}$ (which corresponds to the bandwidth of the closed loop transfer function). As frequency increases above $\omega_{BW}$, the magnitude of the transfer function falls off rapidly. This "peaking" region in the transfer function is labeled as 132.

The magnitude of this peaking is very critical for many applications. For example, the SONET specification limits the acceptable peaking to 0.1 dB. If allowed to exceed this limit, frequency components of input data jitter which fall within this peaking region are actually amplified by the PLL. If several such PLLs are coupled sequentially, the jitter may be amplified to a degree which severely compromises the ability to meet jitter tolerances, or even to correctly recover data.

If we define:

$$\frac{\omega_{BW}}{\omega_z} = \frac{\gamma}{\gamma - 1} \quad \text{(Eq. 3)}$$

From the SONET specification of 0.1 dB, we arrive at a value of gamma of 1.01. Consequently, $$\frac{\omega_{BW}}{\omega_z} = 101 \quad \text{(Eq. 4)}$$

and $$\frac{I}{CK} = \frac{\omega_{BW}}{101} \quad \text{(Eq. 5)}$$

For the OC48 data rate of the SONET specification, the loop bandwidth must meet the following relationship:

$$\omega_{BW} \leq 2\pi 2 \text{ MHz} \quad \text{(Eq. 6)}$$

The magnitude of the gain factor K is set by the loop bandwidth and the VCO gain, $K_V$, and is typically much less than unity, such as, for example:

$$\frac{4\pi}{50} \cong 0.25 \quad \text{(Eq. 7)}$$

To achieve a reasonably fast charge pump in, for example, 0.25 μ semiconductor technology, the value of I may be advantageously set to 100 μA. Calculating for the required magnitude of the loop filter capacitor, we arrive at:

$$C \geq 101 \frac{I}{K}\left(\frac{1}{\omega_{BW}}\right) \qquad \text{(Eq. 8)}$$

$$C \geq 100 \frac{100\ \mu A}{0.25}\left(\frac{1}{2\pi 2\ \text{MHz}}\right) = 3.2\ \text{nF}$$

This amount of capacitance (3.2 nF) is difficult to integrate onto an integrated circuit without requiring large amounts of die area for the capacitor. For lower data rates, an even greater amount of capacitance is required (e.g., 16 times as much for OC3). For this reason, the loop filter capacitor is usually provided externally. But such an external capacitor adds an additional complexity to board layout, and introduces noise susceptibility on the extremely critical loop filter node within the PLL.

There have been other attempts to reduce the size of the required loop filter capacitor. One such method is described by Bulzachelli in U.S. Pat. No. 5,036,298 in which the input data signal is routed through a variable delay block, whose output is then routed to the phase detector. This results in a zero placed in the loop feedback path that does not appear in the closed loop transfer function, and hence there is no peaking in the closed loop transfer function. The large filter capacitor otherwise required at least partially to achieve acceptably low peaking is not required to be as large. While this is an elegant engineering solution, there are nonetheless difficulties which must be dealt with to implement such a solution requiring a variable delay block. First, it may be difficult to implement a variable delay block having an adequate delay range, especially in multi-rate applications. Additionally, the variable delay block must accurately delay the data signal in spite of the random nature of data transitions in the data signal, where the time between transitions is not necessarily constant. Moreover, the variable delay block represents yet another block of circuitry that must operate at the fill data rate, and consequently its power dissipation may not be insignificant, especially when a low power clock and data recovery implementation is desired.

In spite of these previous efforts, and notwithstanding the long history of engineering efforts refining the design of phase locked loops, most PLLs still require either a large external capacitor or require significant additional integrated circuit die area to implement the loop filter capacitor monolithicly. Therefore, additional improvements which can reduce the size of the loop filter capacitor are still greatly desired.

SUMMARY OF THE INVENTION

In a feedback system, such as a PLL, the integrating function associated with a loop filter capacitor may be implemented digitally rather than using a traditional integrating capacitor. The area required for such a digital integrating block is easily implemented on the same integrated circuit die as the PLL. There is no need for either an external loop filter capacitor nor for a large loop filter capacitor integrated on the same integrated circuit die as the PLL. Consequently, printed wiring board layout issues are simplified, and at least one dedicated package pin may be eliminated. Other kinds of feedback systems can also benefit by implementing a loop filter capacitor function or other long time constant requirement by digitally synthesizing the integrating capacitor.

In certain embodiments of the invention an analog phase detector may be utilized, whose phase error output signal is converted to a digital signal by an analog-to-digital (A/D) converter. In other embodiments a digital phase detector may be utilized whose phase error output signal is already a digital signal. The digital phase error signal may be digitally "integrated" by a digital integration block including, for example, a digital accumulator block, whose output is then converted back to an analog signal, filtered, optionally combined with a loop feed-forward path signal, and then conveyed as a control voltage to the voltage-controlled oscillator. The equivalent "size" of the integrating capacitor function provided by such an arrangement may be varied by increasing or decreasing the number of bits within the digital accumulator block. For example, the number of bits may be changed to adjust a loop filter for different incoming data rates or input frequencies. Consequently, an increasingly larger equivalent capacitor may be implemented by adding additional digital stages, each of which consumes low power and requires a small incremental integrated circuit area.

The required resolution of the digital accumulator output may be less than the number of bits in the accumulator, which allows the lower order bits to be decimated. The high order portion of such a digital accumulator may then be operated at a far lower clock rate than lower order portions, thus reducing power consumption.

BRIEF DESCRIPTION OF THE DRAWINGS

The present invention may be better understood, and its numerous objects, features, and advantages made apparent to those skilled in the art by referencing the accompanying drawings.

FIG. 13B is a schematic diagram of an embodiment of a digital accumulator block shown in FIG. 11.

The use of the same reference symbols in different drawings indicates similar or identical items.

DESCRIPTION OF THE PREFERRED EMBODIMENT(S)

Figure 3:
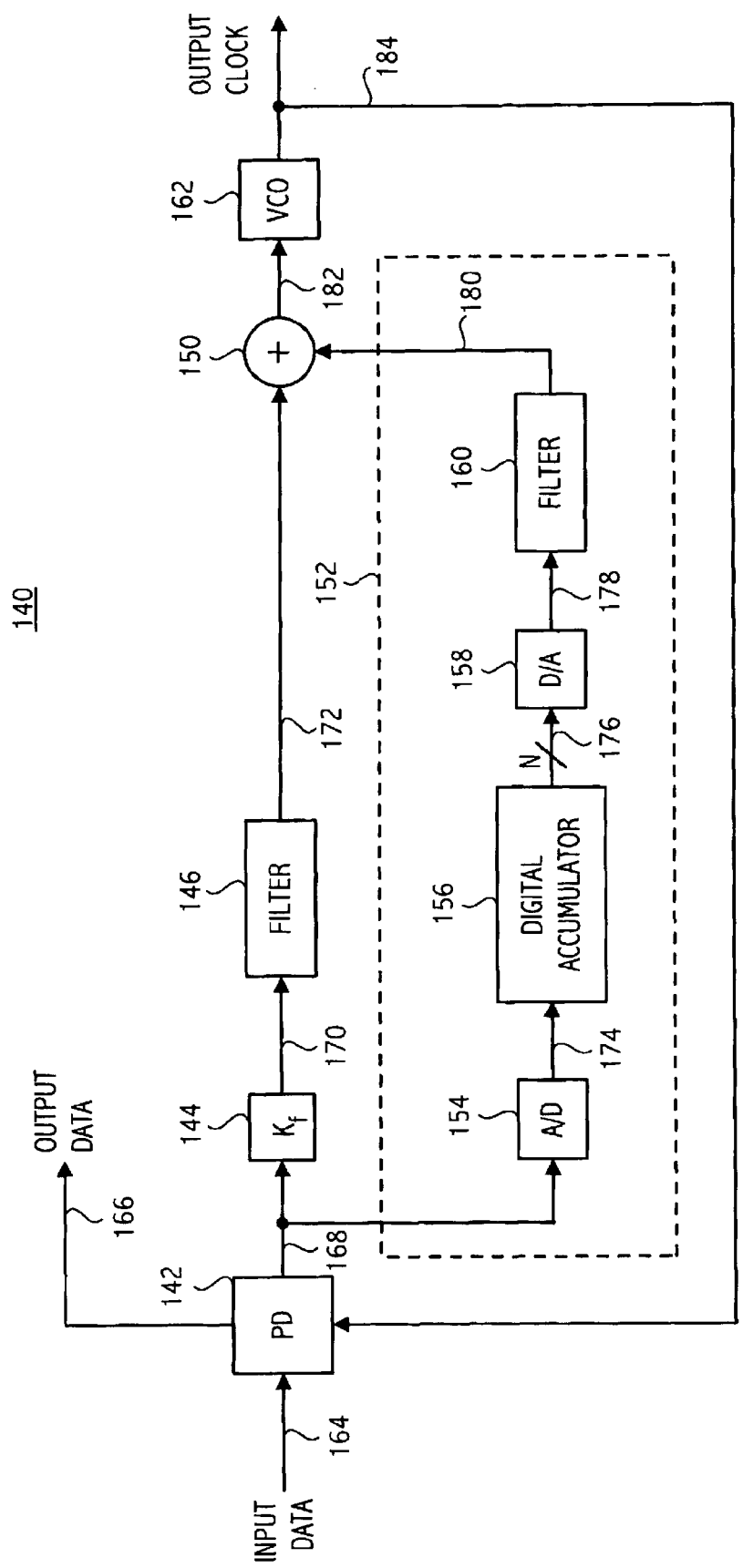
FIG. 3 is a block diagram of an embodiment of a phase locked loop circuit incorporating a digitally-synthesized loop filter capacitor circuit in accordance with the present invention.

An exemplary PLL incorporating a digital integrating block in accordance with the present invention, and which is configured for a clock and data recovery application, is shown in FIG. 3. The phase locked loop 140 includes an analog phase detector 142 which receives the input data signal conveyed on node 164 and the output clock signal of the voltage controlled oscillator (VCO) 162 conveyed on node 184. The analog phase detector 142 generates on its output node 168 an error signal which varies according to the phase difference between the input data signal and the VCO output clock signal, and may also include additional circuitry to generate on an output node 166 the reconstructed output data, as shown. Alternatively, such data sampling circuitry may be implemented external to the analog phase detector 142.

Figure 1:
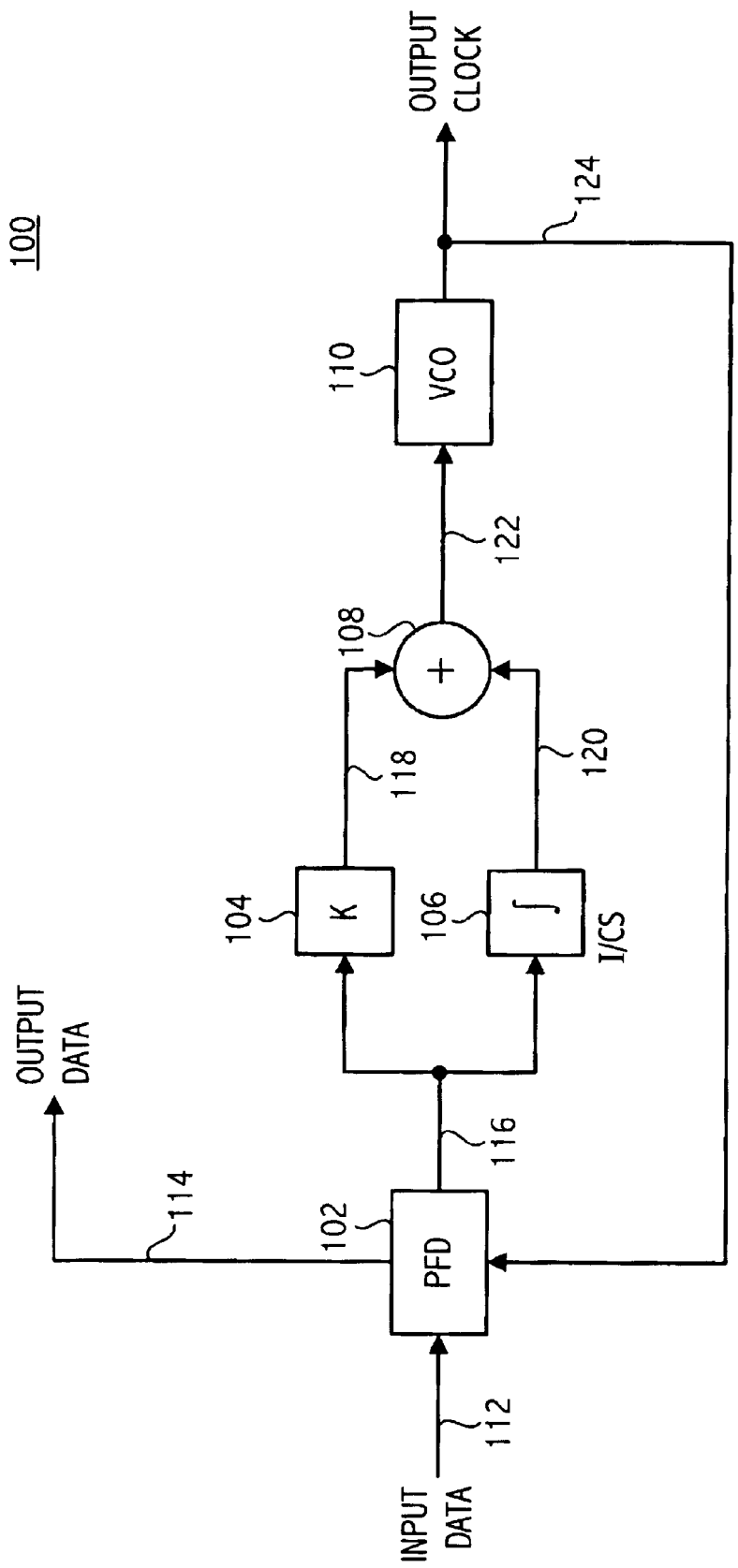
FIG. 1, labeled as prior art, is a block diagram of a traditional phase locked loop arranged to perform a clock and data recovery function.
Figure 2:
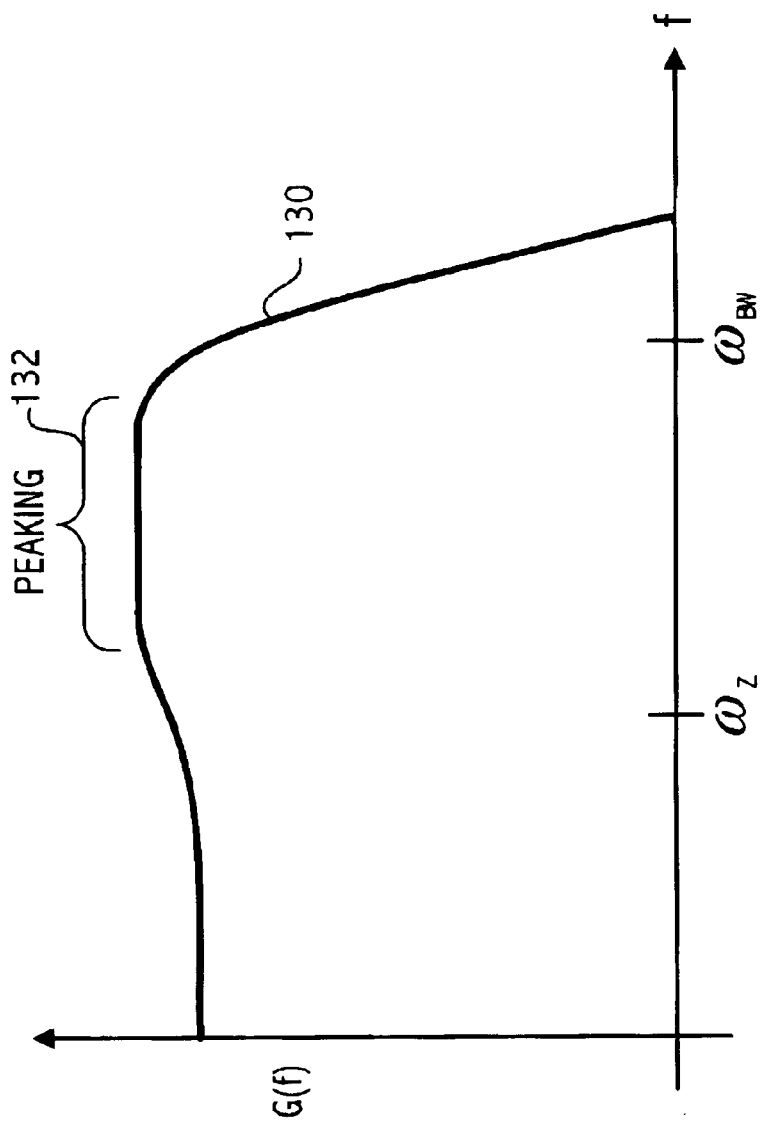
FIG. 2, labeled as prior art, is a graph depicting the closed loop transfer function of the PLL shown in FIG. 1.

The loop filter for this exemplary PLL 140 includes a feed forward path formed by a gain block 144 and a filter block 146, and further includes a digital integrating block 152. The output of the feed forward path, which is conveyed on node 172, and the output of the digital integrating block 152, which is conveyed on node 180, are combined by summer block 150 to generate a control signal on node 182 for the voltage controlled oscillator 162 in a manner similar to the above described PLL shown in FIG. 1. Alternatively, the VCO 162 may include two different control inputs, connected respectively to nodes 172 and 180, thus eliminating the need for a separate summer block.

The digital integrating block 152 includes an A/D converter 154, a digital accumulator 156, a D/A converter 158, and a filter block 160. The A/D converter 154 receives the analog phase error output signal from the analog phase detector 142, which is conveyed on node 168, and generates on its output node 174 a digital representation of the analog phase error voltage. The digital accumulator 156, which includes a multiple-bit register to represent the cumulative (i.e., integrated) value of the phase error, takes each digital phase error representation from the A/D converter 154 and increases or decreases the cumulative value accordingly. For example, if the digital phase error representation corresponds to a "positive" voltage, the digital accumulator 156 will increase the cumulative value stored in its output register. Conversely, if the digital phase error representation corresponds to a "negative" voltage, the digital accumulator 156 will decrease its cumulative value stored in its output register. In the context used here, "positive" and "negative" values merely are understood to mean values relative to a neutral (no phase error) value of the analog phase error signal. The actual voltages may or may not be positive or negative with respect to a ground reference voltage. Frequently, the analog phase error signal conveyed on node 168 is a differential signal (conveyed, in that case, on a pair of output nodes 168), and "positive" and "negative" merely refers to the polarity of such a signal. As will be described below, a variety of suitable A/D converter structures may be used.

The multiple-bit output register of the digital accumulator 156 holds a digital representation of an integrated value of the phase error, analogous to the function usually performed by a charge pump and a large loop filter capacitor. This digital value is communicated on an N-bit wide output bus 176 to the D/A converter 158 which converts the digital representation back into an analog signal conveyed on its output node 178, whereupon the filter block 160 provides a smoothing function to the reconstructed analog signal. The output of the filter block 160 is then conveyed on node 180 to the summer block 150 (or alternatively, directly to the VCO 162).

The digital accumulator 156 may be implemented using any of a variety of structures. For example, an adder may be used if the digital representation conveyed on node 174 includes an appropriate polarity indication of the digital value represented. Alternatively, various counter structures (e.g., an up/down counter) may also be utilized, as further described below.

Figure 4:
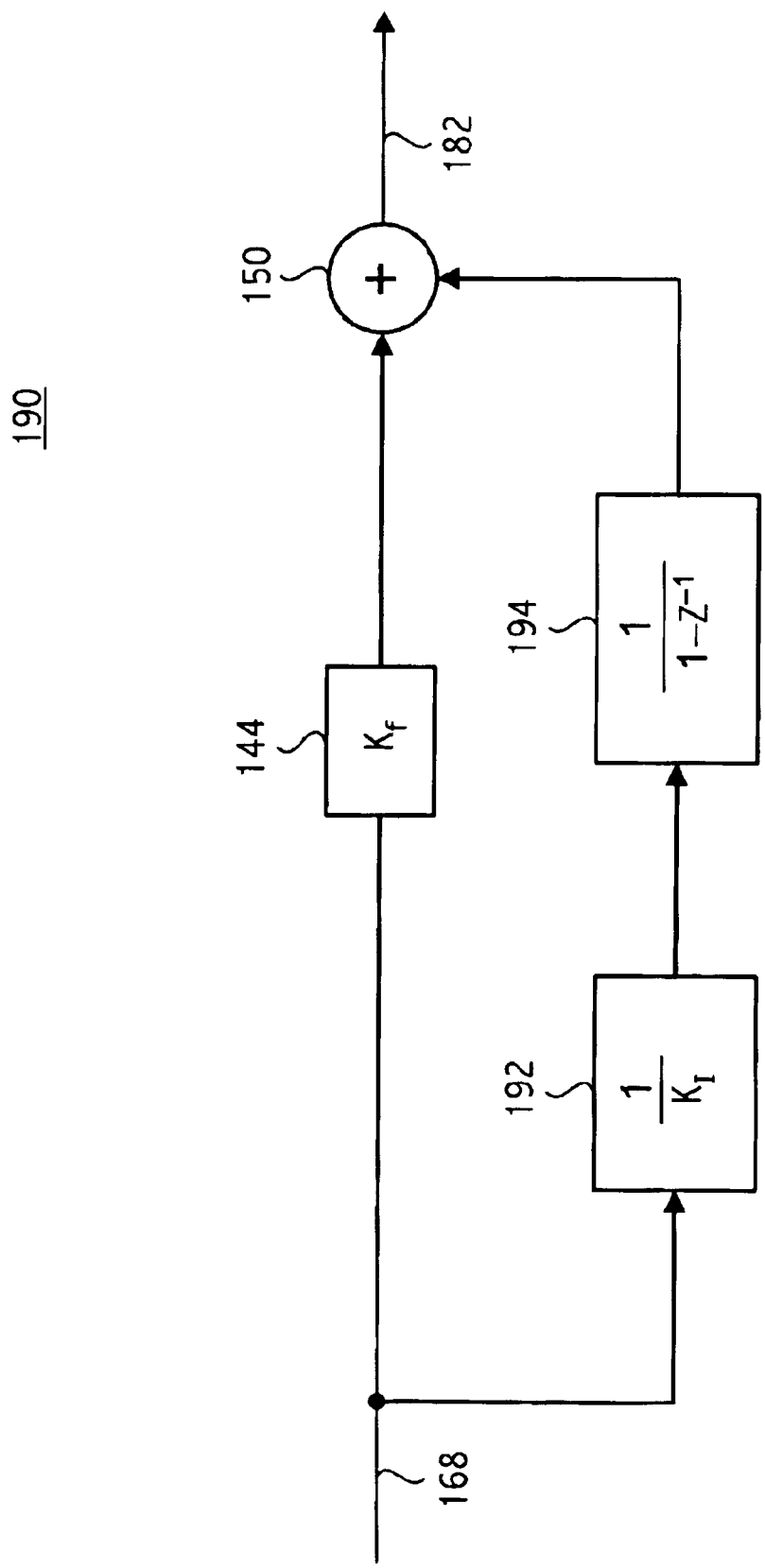
FIG. 4 is a block diagram of a model for the overall loop filter for the phase locked loop circuit shown in FIG. 3.

Referring now to FIG. 4, a model of the overall loop filter described above is represented. The input node to the loop filter is node 168 (which receives the analog phase error signal), and the output of the loop filter is node 182, upon which a control signal for the VCO 162 is conveyed. The forward gain block 144 and the summer block 150 also serve well as their respective models. The A/D converter 154, the digital accumulator 156, and the D/A converter 158 collectively are modeled by the pair of elements 192 and 194. (The filter block 160 may be ignored in the model since it can be designed to have negligible influence on the PLL dynamics.) Model block 192 represents an attenuation resulting from the digital accumulator 156 which increases as the bit-width of the digital accumulator 156 increases, while model block 194 represents an accumulator or digital integrator structure which adds its previous value to the present input value to arrive at a new present value.

The loop filter transfer function of this loop filter may be written as:

$$H(z) = K_f + \frac{1}{K_1}\left(\frac{1}{1-z^{-1}}\right) \qquad \text{(Eq. 9)}$$

This expression may be simplified by observing that, at low frequencies (i.e., $\ll 1/T$):

$$\frac{1}{1-z^{-1}} \Rightarrow \frac{1}{1-e^{-j2\pi fT}} \approx \frac{1}{j2\pi fT} \qquad \text{(Eq. 10)}$$

where T represents the sampling period of the analog-to-digital conversion (and implicitly the period of the digital accumulator as well). Consequently, the transfer function may be re-written as:

$$H(z) = K_f + \frac{1}{K_1}\left(\frac{1}{1 - e^{-j2\pi fT}}\right) \quad \text{(Eq. 11)}$$

$$H(z) \approx K_f + \frac{1}{K_1}\left(\frac{1}{j2\pi fT}\right)$$

$$H(s) = \frac{1 + s \cdot K_f K_1 T}{s \cdot K_1 T}$$

A zero may be achieved in this transfer function at a frequency of 10 kHz or below (as per the OC-48 SONET specification) when the following relation is true:

$$K_f K_1 T \geq \frac{1}{2\pi(10 \text{ kHz})} \quad \text{(Eq. 12)}$$

This relationship confirms that a zero may be achieved at suitably low frequencies without the need for a large capacitor by simply setting the value of $K_f K_1 T$ to an appropriate value. Moreover, since a large loop filter capacitor is not required, there is no need for either an external loop filter capacitor nor for a large loop filter capacitor integrated on the same integrated circuit die as the PLL. The various other filter-related capacitors are much smaller in size and may be easily integrated on-chip. Consequently, printed wiring board layout issues are simplified, and at least one dedicated package pin is eliminated. Moreover, since a traditional loop filter capacitor is coupled to a node that is highly sensitive to potential noise (any noise quickly propagates to the VCO control node), the potential noise source associated with coupling the loop filter capacitor node from off-chip is eliminated. As a result, a PLL incorporating a digital integrating block as described above promises to be less sensitive to noise than traditional designs incorporating a loop filter capacitor.

Figure 5:
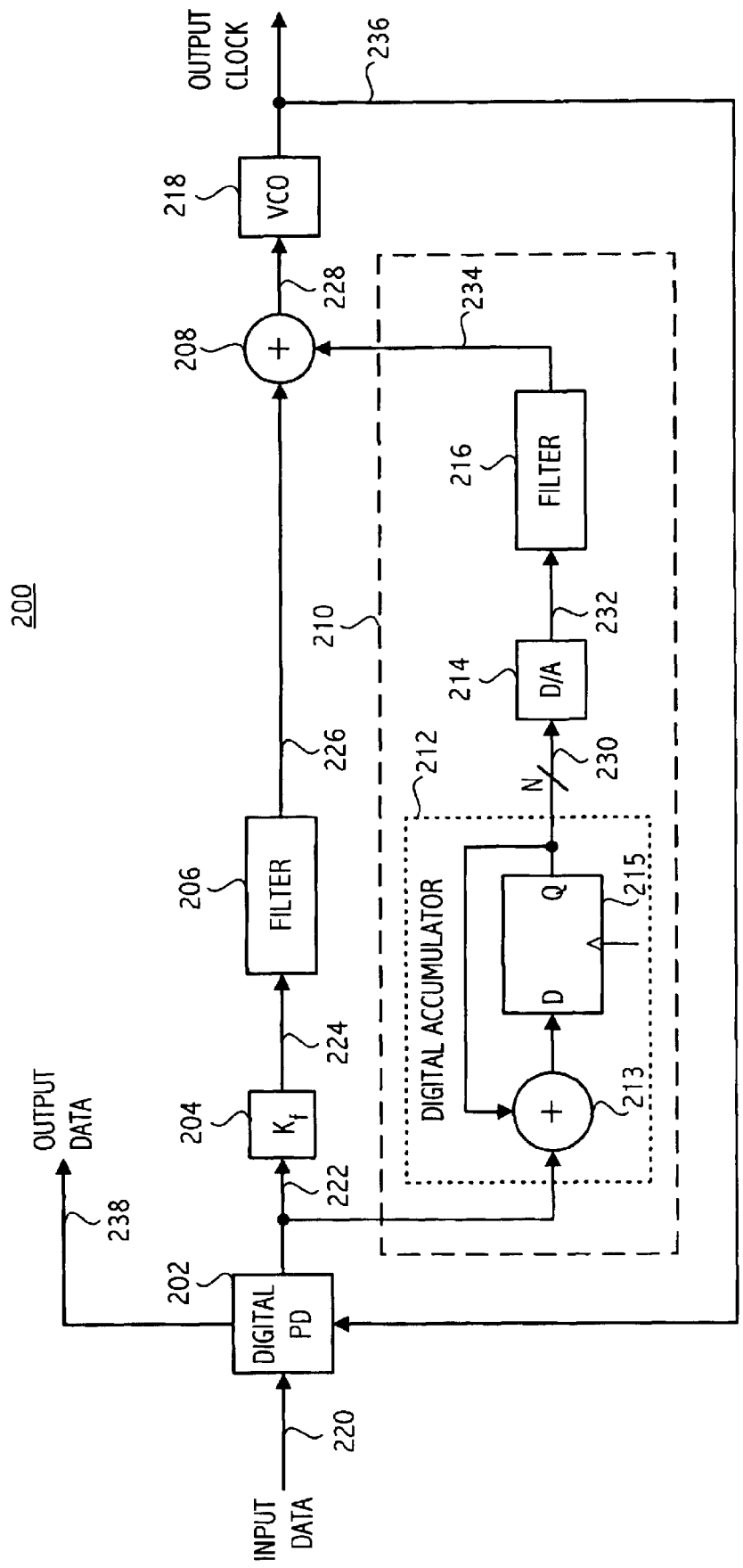
FIG. 5 is a block diagram of another embodiment of a phase locked loop circuit incorporating a digitally-synthesized loop filter capacitor circuit in accordance with the present invention.

Referring now to FIG. 5, another embodiment of a PLL is shown which also incorporates a digital integrating block. In this embodiment, a phase detector having a digital output signal is used, which eliminates the requirement for a separate analog-to-digital converter otherwise required in the loop integrating path. The phase locked loop 200 includes a digital phase detector 202 which receives the input data signal conveyed on node 220 and the output clock signal of the voltage controlled oscillator 218 conveyed on node 236. The digital phase detector 202 generates on its output node 222 an error signal which digitally encodes the phase difference between the input data signal and the VCO output clock signal. The digital phase detector 202 may also include additional circuitry to generate on an output node 238 the reconstructed output data, as shown.

The loop filter for this exemplary PLL 200 includes a feed forward path formed by a gain block 204 and a filter block 206, and further includes a digital integrating block 210. The output signal of the feed forward path, which is conveyed on node 226, and the output signal of the digital integrating block 210, which is conveyed on node 234, are combined by summer block 208 to generate a control signal on node 228 for the voltage controlled oscillator 218.

The digital integrating block 210 includes a digital accumulator 212, a D/A converter 214, and a filter block 216. The digital accumulator 212, which conceptually includes a summer 213 and a multiple-bit register 215 to represent the cumulative (i.e., "integrated") value of the phase error, receives each digital phase error representation from the digital phase detector 202, which is conveyed on node 222, and increases or decreases the cumulative value accordingly, as described above. For example, if the digital phase error representation corresponds to a "leading" phase relationship, the digital accumulator 212 will increase (or alternately, decrease) the cumulative value stored in its output register. Conversely, if the digital phase error representation corresponds to a "lagging" phase relationship, the digital accumulator 212 will decrease (or alternately, increase) its cumulative value stored in its output register. While this and other block diagrams are described using the terminology of a single node connecting the blocks, it should be appreciated that, when required by the context in the various embodiments, such a "node" may actually represent a pair of nodes for conveying a differential signal, or may represent multiple separate wires (e.g., a bus) for carrying several related signals.

As described above, the multiple-bit output register of the digital accumulator 212 holds a digital representation of an integrated value of the phase error. This digital value is preferably communicated on an N-bit wide output bus 230 to the D/A converter 214 which converts the digital representation back into an analog signal conveyed on its output node 232, whereupon the filter block 216 provides a smoothing function to the reconstructed analog signal. The output of the filter block 216 is then conveyed on node 234 to the summer block 208 (or alternatively, directly to the VCO 218).

As stated above, because a phase detector having a digital output signal is used, the requirement for a separate analog-to-digital converter, which exists only in the digital integrating block, is eliminated. This allows a low offset to be achieved in the phase error through the feed forward path because both the feed forward path and the integrating path receive the same digital signal. As used herein, a digital phase detector is one having an output signal which is quantized in time and quantized in value, even if such digital output signal linearly encodes the phase error.

It should be understood that a classical implementation of a digital phase detector, such as a "bang-bang" phase detector, has several disadvantages, at least for certain applications. Such a phase detector arrangement requires registers within the phase detector to operate with a very narrow metastability window, otherwise the input jitter and phase offset are all the more accentuated, due to the phase detector's inability to encode small amounts of phase error. Moreover, such a bang-bang detector, whose output polarity is steered by the polarity of the phase error, but whose output magnitude and duration (per clock cycle) is fixed irrespective of the actual magnitude of the phase error, gives rise to non-linear PLL dynamics. Nontheless, such a phase detector may be utilized in certain embodiments. An exemplary bang-bang phase detector is described in "Clock Recovery from Random Binary Signals," J. D. H. Alexander, Electronics Letters, Vol. 11, pp. 541–542, Oct. 1975, which is hereby incorporated by reference.

Figure 6:
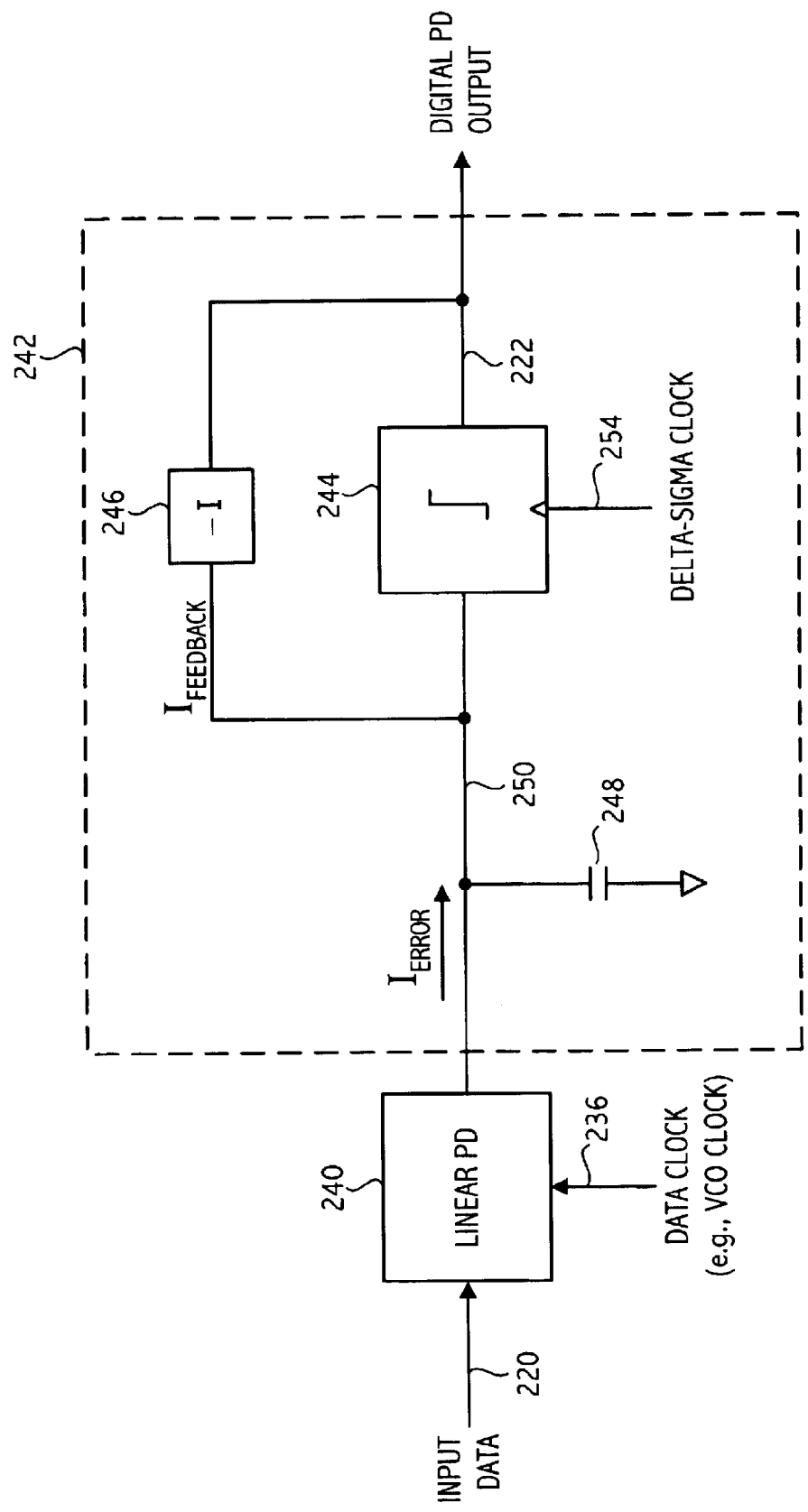
FIG. 6 is a conceptual block diagram of a digital phase detector incorporating a delta-sigma modulator.

A preferable digital phase detector is depicted conceptually in FIG. 6. This exemplary digital phase detector 202 includes, for this embodiment, a linear phase detector 240 followed by a first-order delta-sigma modulator 242. The linear phase detector 240 compares the phase of the input data signal conveyed on node 220 to the phase of the data clock signal (which may be the VCO clock or a divided-down version thereof when used in a multi-rate device) conveyed on node 236, and generates an output signal that varies substantially linearly with phase difference between its input signals, at least over a certain range of phase difference (e.g., approximately $-\pi$ to $+\pi$). Preferably, a linear phase detector output signal has either or both an amplitude or a pulse width that varies substantially linearly with phase difference. Even more preferably, the output signal is a pulse width modulated error signal waveform. In this example, the error signal is a current waveform flowing into or out of node 250, although a voltage signal may also be employed in other circuits.

The delta-sigma modulator 242 then converts the pulse width modulated error signal into a discrete-time and discrete-amplitude digital output signal, in this example generating a one-bit digital output on its output node 222. The delta-sigma modulator 242 includes a modest-sized (e.g., having a typical value of 2–3 pF) integrating capacitor 248 connected to node 250, and further includes a digital comparator block 244 which samples the voltage on its input node 250 when clocked by a delta-sigma clock received on clock node 254. Such a comparator block 244 preferably includes a gain stage followed by a register. The digital output generated on the output node 222 is fed back as a negative current by feedback block 246 into node 250 to provide the requisite feedback into the integrating capacitor 248 of the delta-sigma modulator. Operation of such first-order delta-sigma modulators are well-known to one skilled in the art. Suitable clock rates for the delta-sigma clock are described in greater detail hereinbelow, but preferably are set high enough to reduce quantization noise influence on the feedforward path, yet low enough so that the latching circuit within the comparator resolves when strobed by the comparator clock (i.e., the "delta-sigma clock").

Figure 7A:
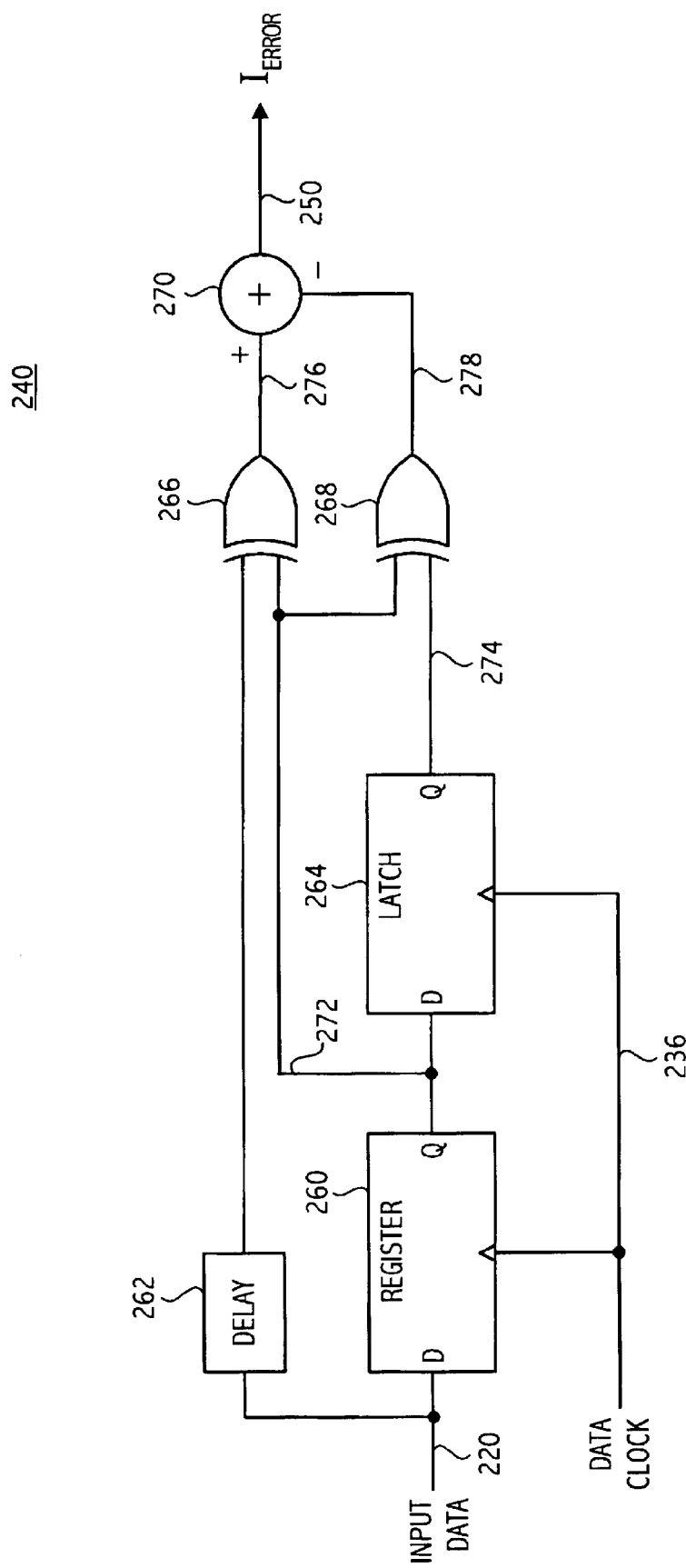
FIG. 7A is a schematic diagram of an embodiment of a linear phase detector useful within the digital phase detector shown in FIG. 6.

An advantageous linear phase detector 240 is illustrated in FIG. 7A. Similar circuits are generally well known in the art. In this circuit, a register 260 samples the input data signal conveyed on node 220 when clocked by the data clock signal conveyed on node 236. The first XOR gate 266 generates on its output node 276 a variable-width pulse of duration generally equal to the time by which an input data signal transition leads the corresponding transition on node 272, which is controlled, of course, by the data clock. The delay block 262 is included to compensate for the clock-to-Q delay of the register 260. When the data clock is correctly aligned to the input data signal (i.e., data clock transitions at precisely the mid-point of the data bit-intervals), the register 260 generates on its output node 272 a signal that replicates the input data signal, but delayed by one-half period of the data clock, and the pulse on node 276 is of a duration exactly equal to one-half period of the data clock.

The latch 264 generates on its output node 274 a signal which replicates its input signal on node 272, but delayed by one-half period of the data clock. As a result, the second XOR gate 268 generates on its output node 278 a pulse with a duration that is always equal to one-half the period of the data clock. The fixed-duration pulse signal conveyed on node 278 is subtracted from the variable-width pulse signal conveyed on node 276 by summing block 270. When the data clock is correctly aligned, both pulse signals have equal durations, and the summing block 270 generates a zero-valued net error current. If the input data transition arrives too early, the pulse signal on node 276 is longer than the pulse signal on node 278, and a net error current is generated by the summing block 270. Obviously, the remainder of the PLL is arranged to respond to such polarity of error current in a direction to advance the phase of the data clock. Preferably, an additional latch (not shown) is included between the register 260 and the latch 264 to insulate the earlier signal entering the XOR gate 268 from variations in the timing of node 272 resulting from varying input data timing (i.e., variations in clock-to-Q timing of register 260 as a function of its input data setup time). In such a configuration, the two inputs of the second XOR gate 268 are still preferably taken from the input and output nodes of the latch 264.

Figure 7B:
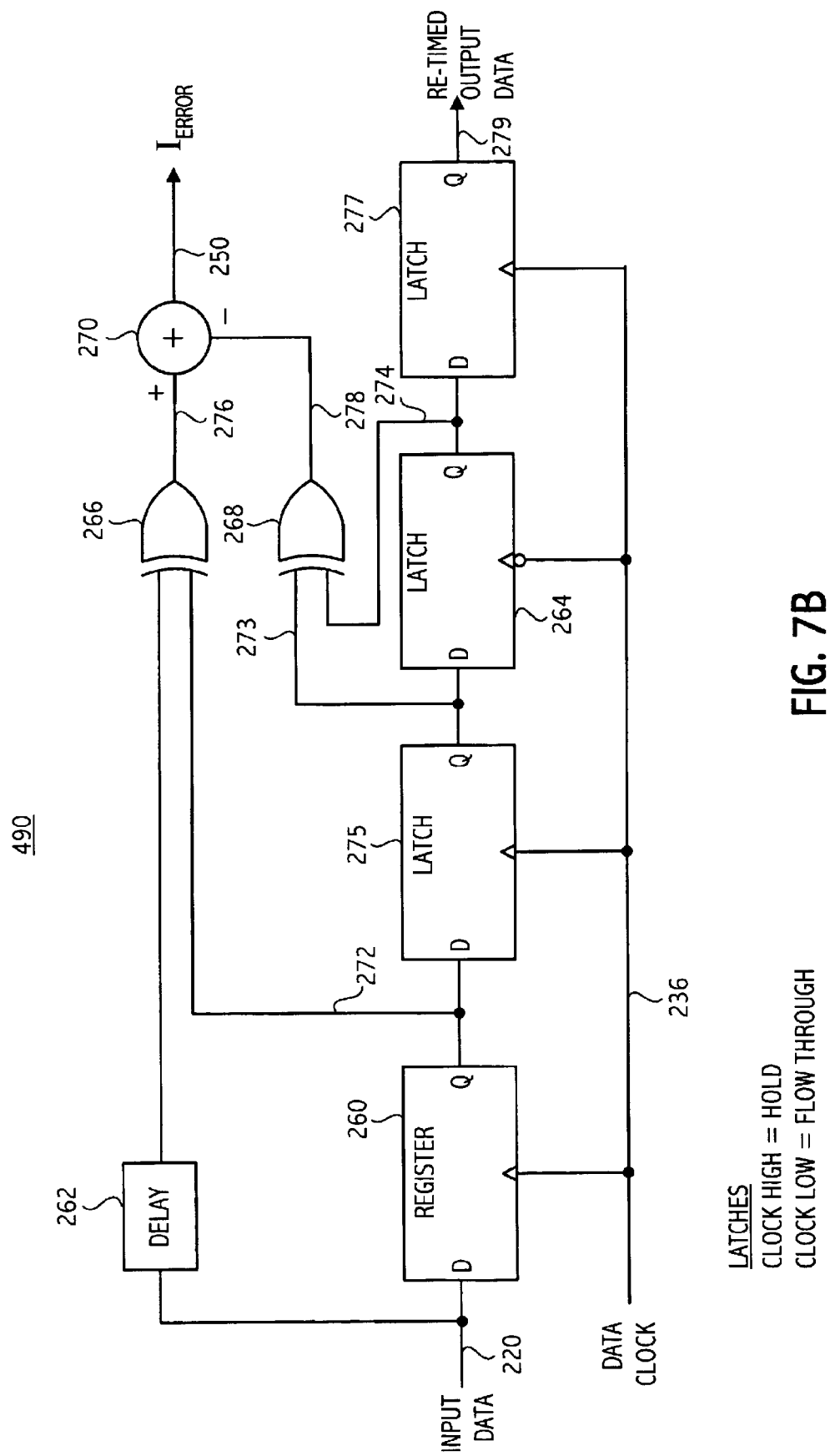
FIG. 7B is a schematic diagram of another embodiment of a linear phase detector useful within the digital phase detector shown in FIG. 6.

Such an improved linear phase detector 490 is illustrated in FIG. 7B. A latch 275 is shown connected between the register 260 and the latch 264, and the inputs to the second XOR gate 268 are taken from the input and output nodes of latch 264, being nodes 273 and 274. As a result, the second XOR gate 268 still generates on its output node 278 a pulse with a duration that is always equal to one-half the period of the data clock, but is delayed by an additional half-clock period. Described in another fashion, the latch 275 is included between the first pulse generation circuit (comprising register 260 and XOR gate 266) and the second pulse generation circuit (comprising register 264 and XOR gate 268) to improve the accuracy of the one-half data clock period pulse generated by the second pulse generation circuit, and thus to improve the gain uniformity of the phase detector.

Another latch 277 is shown having an input coupled to node 274, for conveying the recovered re-timed data on an output node 279. Such a recovered output data could be taken from any of several latch output nodes (e.g., nodes 272, 273, or 274) but by including an additional latch 277, the capacitive loading on each of these other latch output nodes may be made lower in magnitude and more accurately matching the other latch output nodes. As a consequence, better matching within the two pulse generation circuits within the phase detector 490 results in more accurate pulses and a lower static phase error.

While shown in FIG. 7A and FIG. 7B using single-ended logic blocks and signals, in practice such circuits are preferably implemented using fully differential circuitry. This provides enhanced noise immunity, better speed, and more consistent delays which are independent of data state. Moreover, many of the circuit blocks, such as the summing block 270, are more easily implemented and achieve better matching of currents when implemented differentially, thereby resulting in lower offsets. In particular, the summing block 270 may be advantageously implemented by a "wire-or" connection directly between the outputs of logic gates 266 and 268 to combine the two output signals when such signals are current signals. In such a case, the summing block 270 may be a common load circuit for the common output nodes(s). In other embodiments, the summing block 270 may be implemented as a more distinct circuit.

Figure 7C:
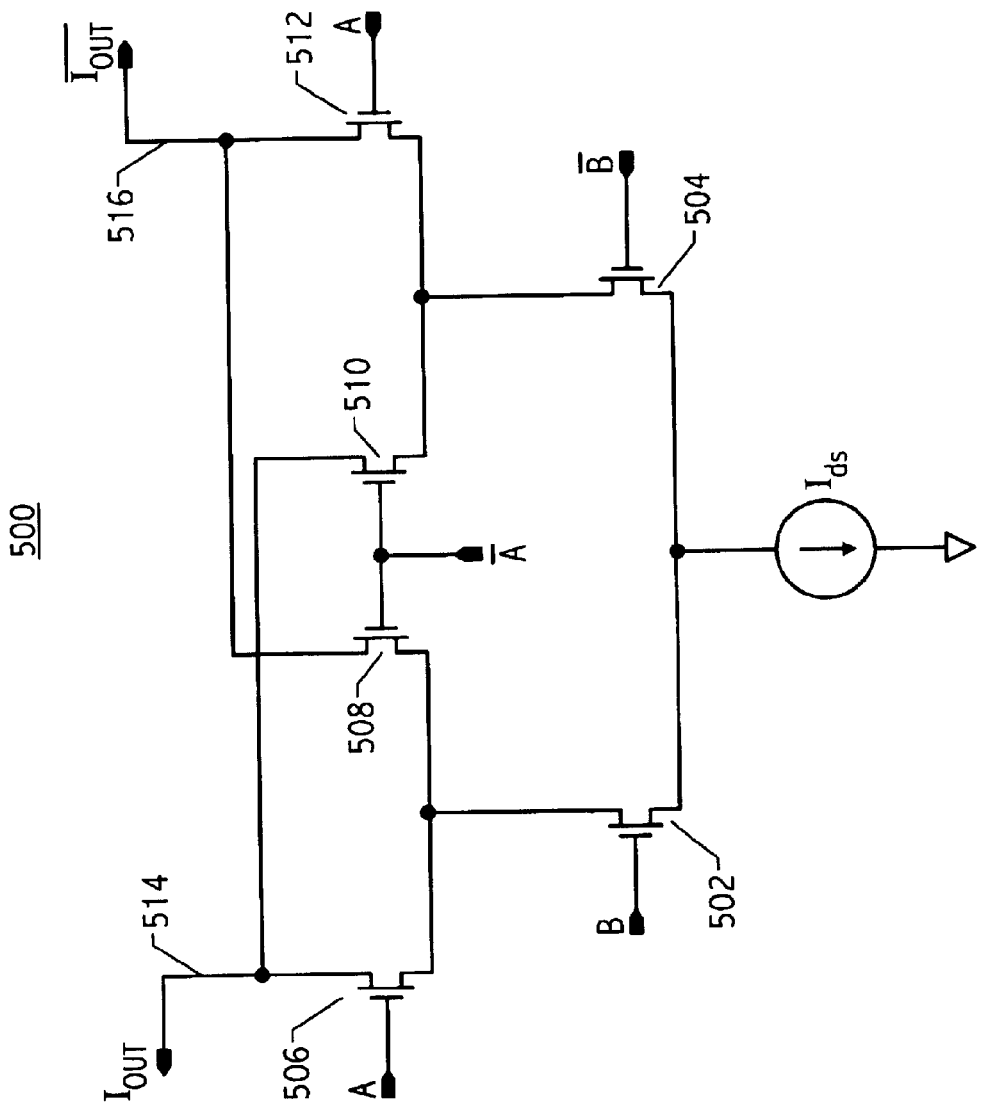
FIG. 7C is a schematic diagram of a logic circuit useful for the phase detector shown in FIG. 7B.

Referring now to FIG. 7C, a preferred embodiment of a differential XOR gate (e.g., gate 266, 268) is depicted. True and complement inputs for a first input A and a second input B are conveyed to the respective gate terminals of various N-channel metal-oxide-semiconductor (NMOS) transistors. A first level differential transistor pair includes transistor 502 and 504 which receive the B and complement-B signals respectively. A second level includes a first differential transistor pair 506 and 508 which receives the A and complement-A signals, respectively, and a second differential transistor pair 510 and 512 which receive the complement-A and A signals, respectively. A differential output current is conveyed on a pair of differential output nodes 514 and 516 in accordance with the XOR function of the two inputs A and B.

Figure 7D:
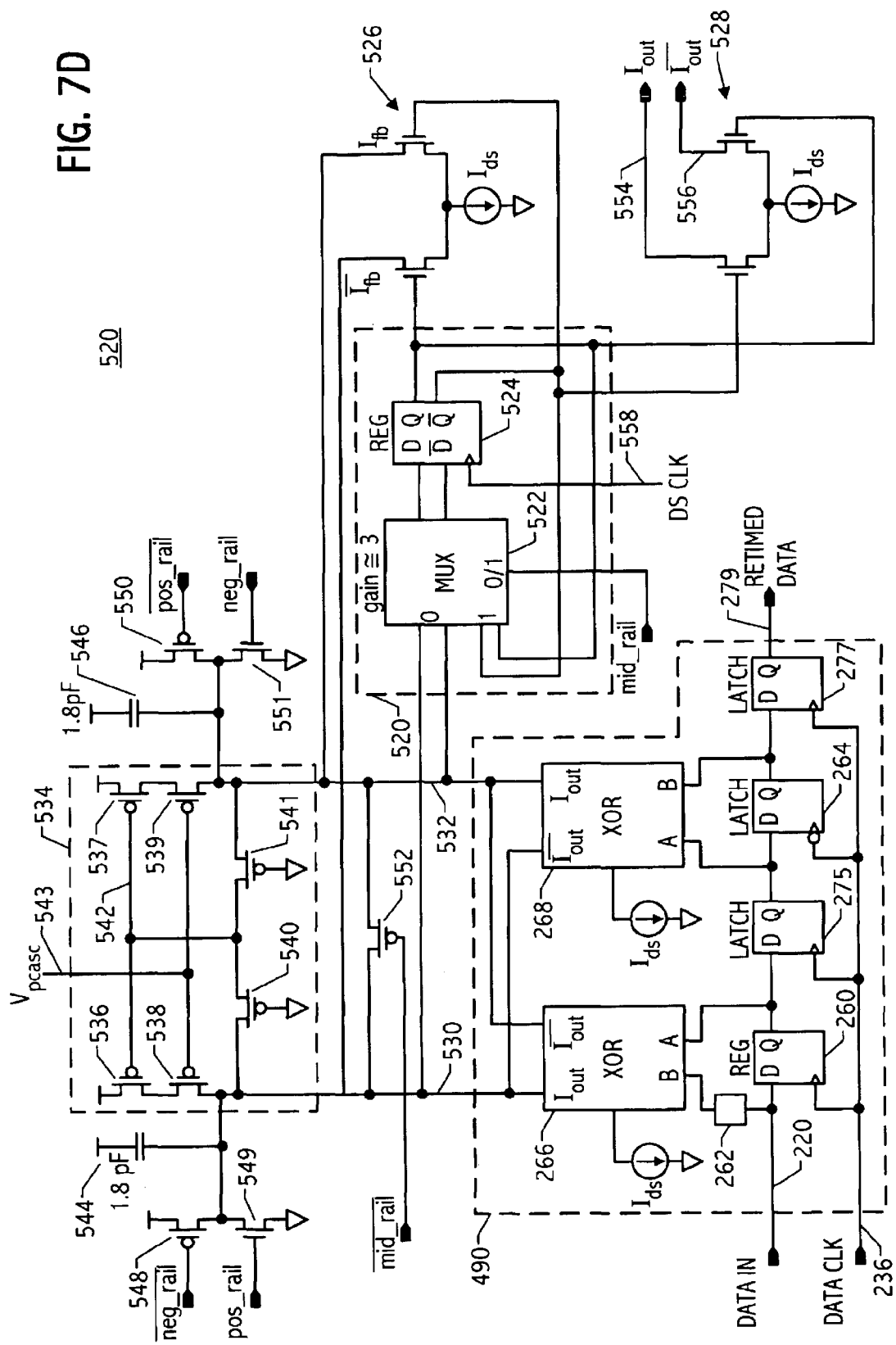
FIG. 7D is a schematic diagram of an embodiment of a digital phase detector in accordance with the present invention.

Referring now to FIG. 7D, a schematic diagram of a preferred embodiment of a digital phase detector 520 is shown, which includes a linear phase detector (such as linear phase detector 490) and a delta-sigma modulator to produce a digital phase detector output signal. The differential current outputs from XOR gates 266 and 268 are combined by directly connecting the outputs together, with the true polarity output from gate 266 and the complement output from gate 268 being coupled to node 530, and the with the true polarity output from gate 268 and the complement output from gate 266 being coupled to node 532. Consequently, only the internal nodes of the XOR gates need operate with a pulse width on the order of half a clock period. A load circuit 534 provides a cascode constant current source load structure for each of nodes 530 and 532. In particular, transistors 536 and 537 are biased by a voltage conveyed on node 542 which is approximately the common-mode voltage of nodes 530 and 532. Cascode transistors 538 and 539 are included in series with transistors 536 and 537 to provide the load circuit 534 with a higher output impedance (i.e., more uniform current magnitude as a function of output voltage). The bias voltage on node 542 is generated by transistors 540 and 541 functioning as a resistive divider, which transistors are preferably long channel, narrow width PMOS transistors to preserve the high output impedance on nodes 530 and 532.

The delta-sigma modulator includes a pair of integration capacitors 544 and 546 connected respectively to the phase detector output nodes 530 and 532, a comparator circuit 520 having a differential input pair coupled to the phase detector output nodes 530 and 532, and a feedback circuit 526 having differential inputs coupled to the differential outputs of the comparator circuit 520 and having differential outputs feeding back and connected respectively to the phase detector outputs 530 and 532. The feedback circuit 526 includes a differential transistor pair (with an associated current source). The delta-sigma modulator also includes a second differential transistor pair (with an associated current source) to provide a differential output signal on nodes 554 and 556.

Several other transistors are provided to support a calibration capability of a PLL incorporating such a digital phase detector. Transistors 548, 549, 550, and 551 are provided to force a full-scale high signal or a full-scale low signal onto phase detector output nodes 530 and 532. When a POS_RAIL signal is asserted, transistor 549 drives node 530 toward ground (i.e., the "negative rail") and transistor 550 drives node 532 toward $V_{DD}$ (i.e., the "positive rail"). Similarly, when a NEG_RAIL signal is asserted, transistor 551 drives node 532 toward ground and transistor 548 drives node 530 toward $V_{DD}$. In these cases, the delta-sigma modulator will generate an output signal corresponding to full scale error signals from the linear phase detector irrespective of the actual phase error between the input signals, and the difference in frequency of the VCO resulting in response to these two different signals may be observed to compute the gain of the PLL.

A third calibration signal MID_RAIL is also shown which forces the delta-sigma modulator to generate an alternating string of 1, −1, 1, −1, etc. on its output nodes 554 and 556. The comparator circuit 520 includes a multiplexer 522 (which also provides a gain of preferably about 3) which couples the outputs of register 524 (i.e., the outputs of the comparator 520) back to the inputs of the register 524 with a reversed polarity, so that the register 524 "oscillates" with each clock edge of a DS_CLK conveyed on the delta-sigma clock node 558. A transistor 552 is turned on during this mid-rail mode to keep the phase detector output node 530, 532 moderately well-behaved even though the feedback circuit 526 is conveying alternating current signals into the nodes.

Figure 8:
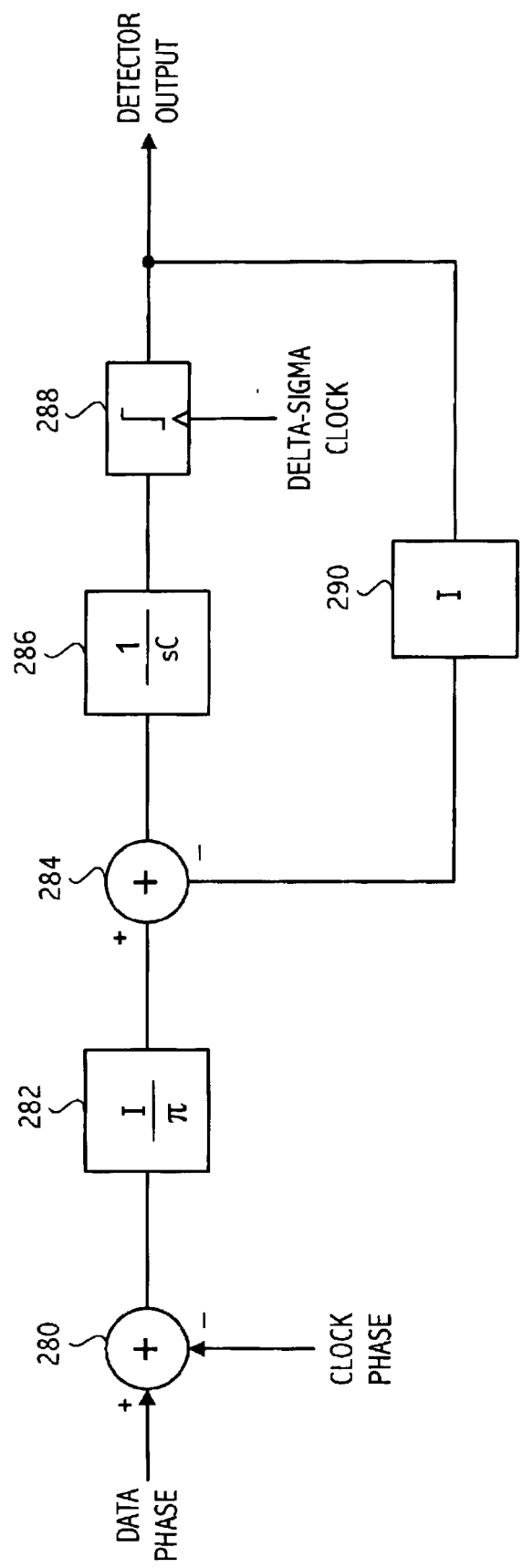
FIG. 8 is a block diagram of the phase detector conceptually depicted in FIG. 6.
Figure 9:
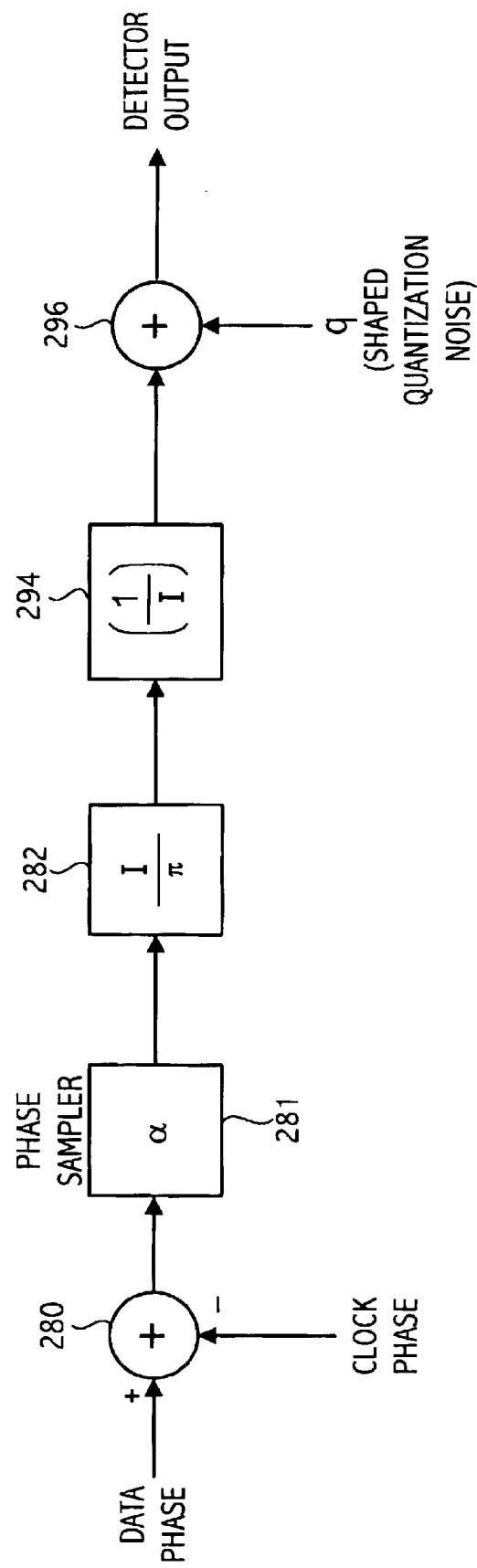
FIG. 9 is a block diagram of another representation of a linearized model of the phase detector depicted in FIG. 6.

Referring now to FIG. 8, a block diagram of the phase detector 202 is illustrated. The summing block 280 and gain block 282 correspond to the linear phase detector 240, while the summing block 284, integrator block 286, comparator block 288, and feedback block 290 correspond to the delta-sigma modulator 242. This model may be represented in the form shown in FIG. 9, in which the delta-sigma modulator 242 is modeled instead by a single block 294 and a summer 296 to include the effects of shaped quantization noise arising from the delta-sigma modulation. The size of the integration capacitor and the magnitude of feedback current (and the linear phase detector currents) are preferably chosen to generate a voltage "ripple" on the delta-sigma integration node (i.e., the input node) which keeps the comparator circuit generally operating outside its metastability region, yet is not so large a ripple to cause non-linearities on the currents being summed.

The benefits of using a digital phase detector, such as the exemplary one described above in relation to FIG. 7D, are several-fold. Of note, the PLL dynamics are linear because the digital phase detector encodes on its output a signal whose value represents a pulse-width modulated phase error signal which linearly varies as a function of the phase difference of the input data signal compared to the data clock. This allows a more straightforward design of the PLL to meet the desired jitter transfer and jitter tolerance specifications. Moreover, no registers within the phase detector are operated, when the data clock is properly aligned, in their metastable region (as occurs with a traditional bang-bang phase detector). This allows registers with a wider metastable region to be used without significant jitter penalty.

Figure 10:
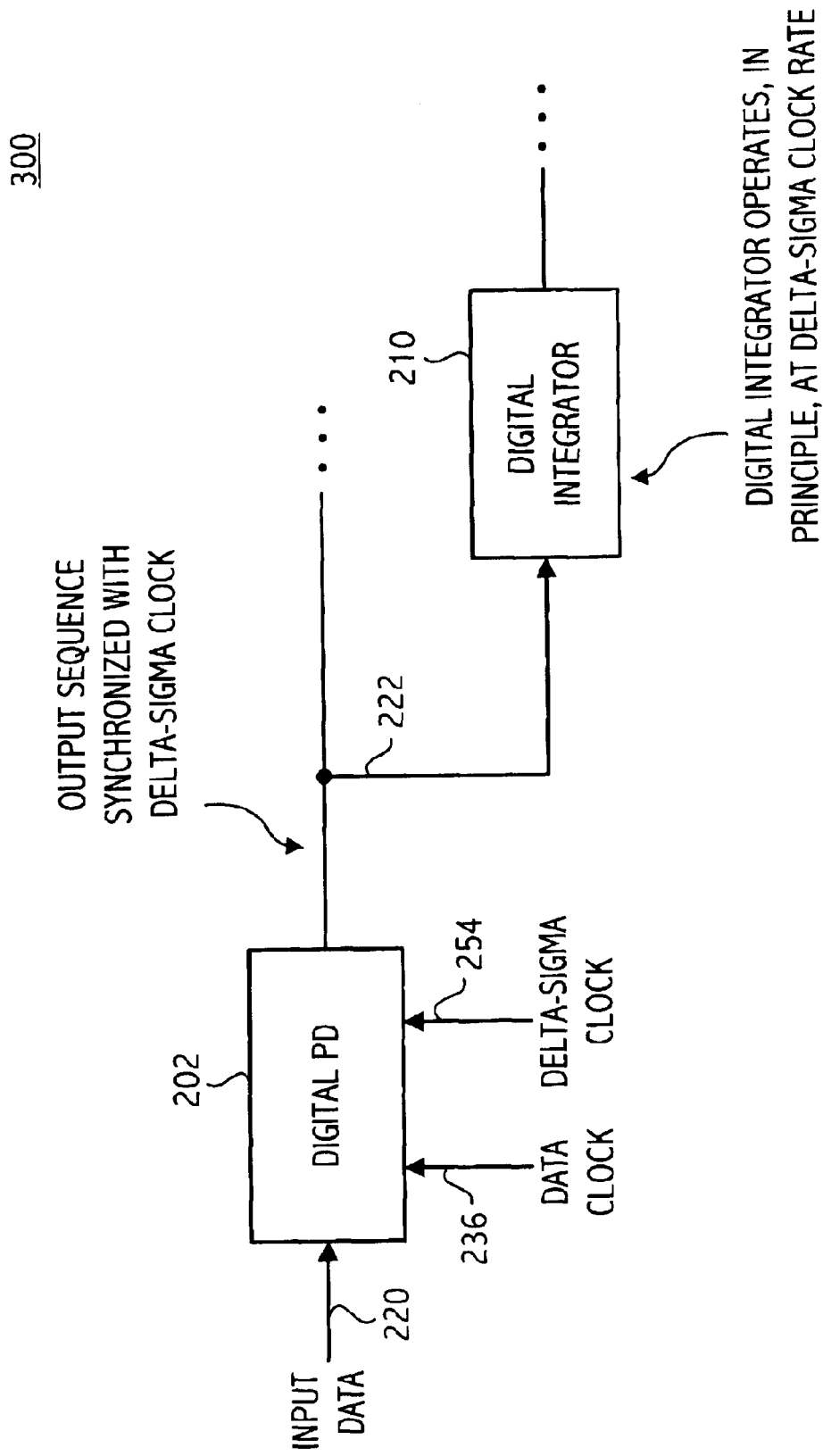
FIG. 10 is a block diagram of a portion of the phase locked loop circuit shown in FIG. 5.

Having described the overall organization of the exemplary PLL thus far, various issues affecting implementation of the digital integrating block (e.g., block 210) are now described. Referring now to FIG. 10, a portion 300 of PLL 200 is depicted which includes the digital phase detector 202 and the digital integration block 210 from earlier FIG. 5. As can be appreciated, the delta-sigma modulator 242 within the digital phase detector 202 is clocked by a delta-sigma clock, and consequently the output signal on node 222 is synchronized to the delta-sigma clock. In order to minimize the impact of quantization noise within the delta-sigma modulator (which can be in the GHz range), this delta-sigma clock should be set to as high a clock rate as possible. For a particular implementation using 0.25 $\mu$ semiconductor technology with a maximum data clock of approximately 2.5 GHz, this delta-sigma clock is advantageously operated at half the data clock rate, or 1.25 GHz. In principle, the digital integration block 210 must also be clocked at the same delta-sigma clock rate since it receives the output signal conveyed on node 222. Unfortunately, operating such circuits as a digital accumulator having, for example, a dozen or more bits of resolution, at a clock rate of, for example, 1.25 GHz leads to extremely high power dissipation in the digital integrator.

Recall the model of the overall loop filter incorporating a digital integrating block, as shown in FIG. 4. To achieve a zero in the loop filter transfer function of less than 10 kHz (for OC48), the following relation was found:

$$K_f K_I T \geq \frac{1}{2\pi(10\ \text{kHz})}$$

For a 1.25 GHz delta-sigma clock rate, the value of $K_f K_I$ is found to be:

$$K_f K_I \geq \frac{1}{2\pi\left(\frac{1}{1.25 \times 10^9}\right)(10 \times 10^3)} = 19{,}894$$

This represents a number greater than $2^{14}$. Without any loss of generality, we can assume that $K_f=1$. Consequently, the value of $K_I$ must be greater than $2^{14}$. The digital accumulator therefore should be at least 15 bits wide since an extra bit is required due to the bilateral requirement of the accumulator range. For lower data rates, an even greater accumulator width is required (e.g., 19 bits for OC3 data rates). Since, for this example, the digital phase detector output is a one-bit signal, the resolution of the digital accumulator 212 is therefore greater than $2^{-14}$ UI (i.e., unit interval). This resolution is much greater than that required to achieve the SONET jitter specifications. For example, a resolution of only $2^{-10}$ UI would be adequate.

Figure 11:
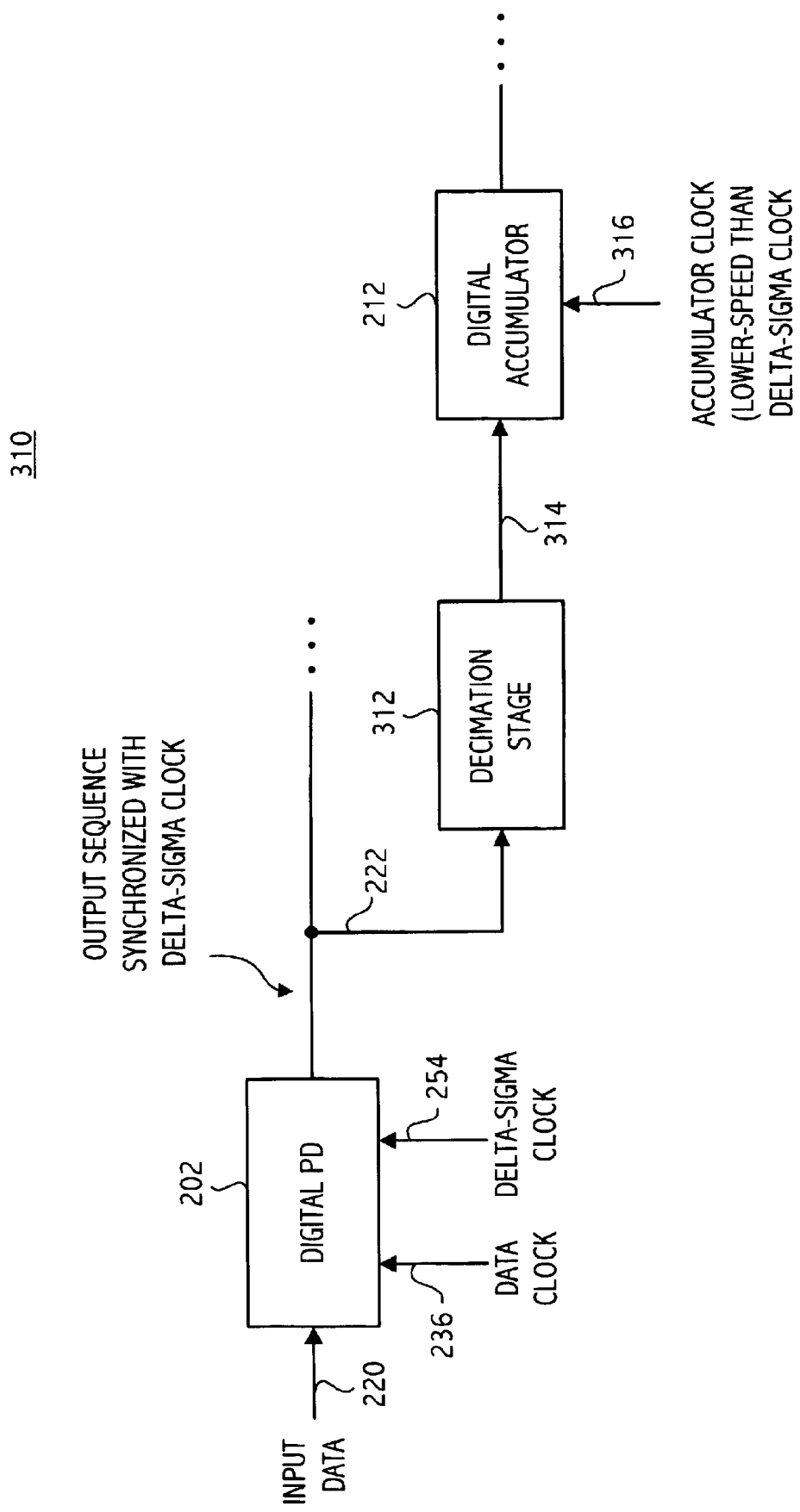
FIG. 11 is a block diagram of a portion of the phase locked loop circuit shown in FIG. 5, which illustrates a digital integrating path incorporating a decimation block.

Referring now to FIG. 11, an improved arrangement is shown which "throws away" the unnecessary resolution to substantially lower the total power dissipation of the digital integrating block. In this arrangement, a decimation stage 312 is preferably included in the path between the digital phase detector 202 and a digital accumulator 212, which allows the digital accumulator 212 to be clocked by an accumulator clock (conveyed on node 316) which has a much lower clock rate than the delta-sigma clock. This results in a significant savings in power dissipation of the digital accumulator 212, and even allowing for the dissipation of the decimation stage 312, a savings in total power dissipation of the digital integrating block. Moreover, a lower speed digital accumulator design is much simpler to implement and more amenable to use of automatic synthesis tools for both its design and layout. It can be designed with virtually any number of bits of resolution without significant increase in power and without much increase in layout area. In other embodiments, a separate decimation stage 312 is not utilized, and the digital accumulator 212 is connected directly to the output of the digital phase detector 202. In such a configuration, a portion of the digital accumulator may itself function as a decimation circuit, as described below.

To arrive at suitable implementations of the decimation stage 312, recall that the output signal from the digital phase detector 202 is an output sequence of ones and zeros generated by the delta-sigma modulator within the digital phase detector. Any transition of the output signal from a one to a zero or from a zero to a one occurs just after the active transition of the delta-sigma clock. Moreover, if the output signal is sampled during each "bit interval" or period of the delta-sigma clock, the number of ones compared to the number of zeros (summed over a number of clock periods) encodes the analog phase error voltage. For example, a higher voltage results in a larger number of ones (compared to zeros) than does a lower voltage (i.e., a larger ones-density in the signal).

Figure 12:
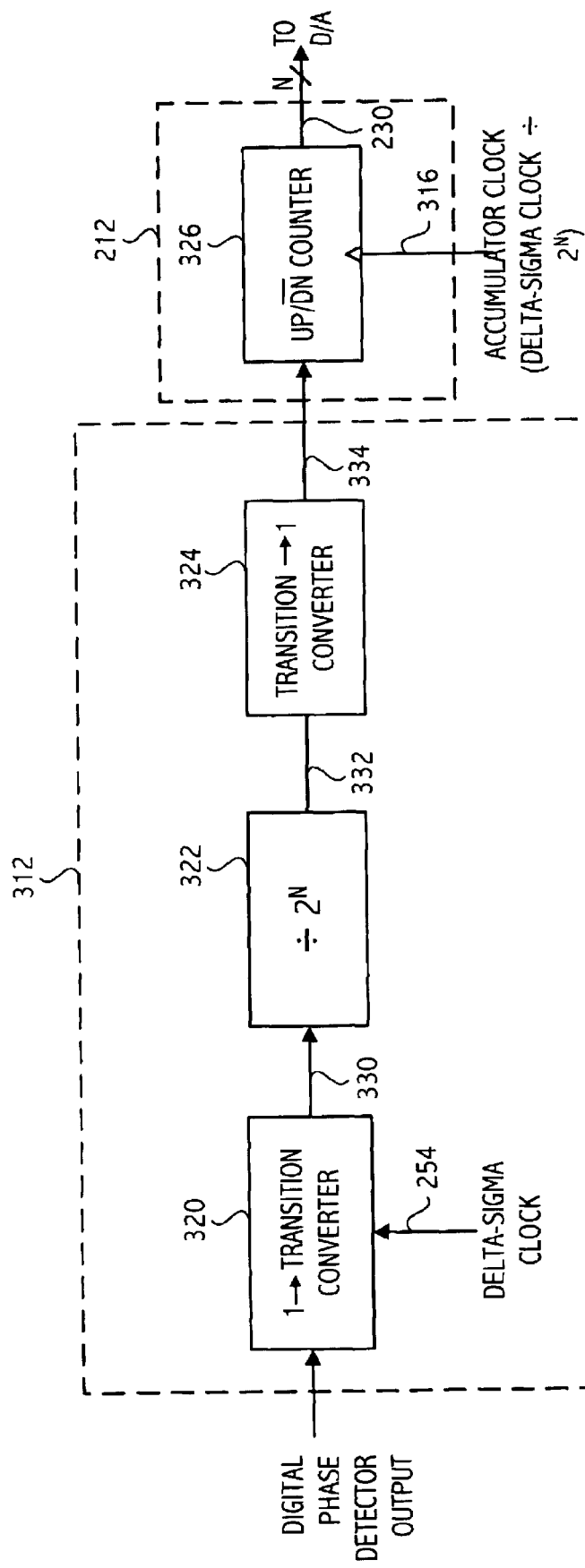
FIG. 12 is a block diagram of a useful decimation block for the circuit portion shown in FIG. 11.

One such suitable decimation stage which takes advantage of this delta-sigma output signal characteristic is shown in FIG. 12 (other decimation circuits are described below). The decimation stage 312 includes a 1-to-transition converter 320, a divide-by-$2^N$ block 322, and a transition-to-1 converter 324. The 1-to-transition converter 320 samples the delta-sigma output signal of the phase detector preferably during each period of the delta-sigma clock (which corresponds to the data interval of the delta-sigma output signal) although sampling at other predetermined intervals is also contemplated. When the phase detector output is sampled as a logic "one", the output signal conveyed on node 330 is caused to transition states (i.e., change states from a one to a zero, or from a zero to a one). However, when the phase detector output is sampled as a logic "zero", the output signal conveyed on node 330 is left unchanged. Consequently, the signal conveyed on node 330 encodes the phase error by the number of transitions in the signal compared to the number of non-transitions in the signal (i.e., the "transition-density" of the signal).

This signal conveyed on node 330 is next communicated to the divide-by-$2^N$ block 322, which may conveniently be a simple ripple counter or other binary counter, and which generates on its output node 332 a divided-down version of its input signal. Such a "transition decimation" circuit generates a transition on its output for every group of transitions on its input signal. The transition-to-1 converter 324 then generates a logic one on its output node 334 upon detecting a transition of its input signal received from the divide-by-$2^N$ block 322. As can be appreciated, the output signal 334 represents a decimated version of the delta-sigma phase error signal: it is likewise an output sequence of ones and zeros, and the number of ones compared to the number of zeros (i.e., the ones-density of the signal) encodes the analog phase error voltage (and thus may be also viewed as a delta-sigma encoded signal). However, the effective clock rate of this decimated signal is now a factor of $2^N$ slower. Further details of such an arrangement are described in greater detail herebelow.

The digital accumulator 212 is implemented in this particular embodiment as an up/down counter 326. The decimated phase error signal is received from node 334 and coupled to the UP/DOWN# control input of the up/down counter 326. An accumulator clock signal conveyed on node 316 is preferably equal in clock rate to the delta-sigma clock signal divided by $2^N$. If the ones-density of the input signal received by the up/down counter 326 is greater than 50%, the value of the counter will, over time, increase. Conversely, if the ones-density is less than 50%, the value of the counter will decrease over time. The rate of increase (or decrease) of the digital counter value depends on the degree by which the ones density of the input signal exceeds 50% (or is less than 50%). Other accumulator structures are contemplated, including a series of stages each comprising an adder whose output is latched in a register. One of the inputs for the adder is taken from the output of the register, and the other input is unused. The input signal for the accumulator is conveyed to the carry in input for the lower-most stage. The respective carry-out signal from each respective stage is coupled to the respective carry-in input for the succeeding stage, and the register outputs for the upper-most stages form the accumulated digital word.

Figure 13A:
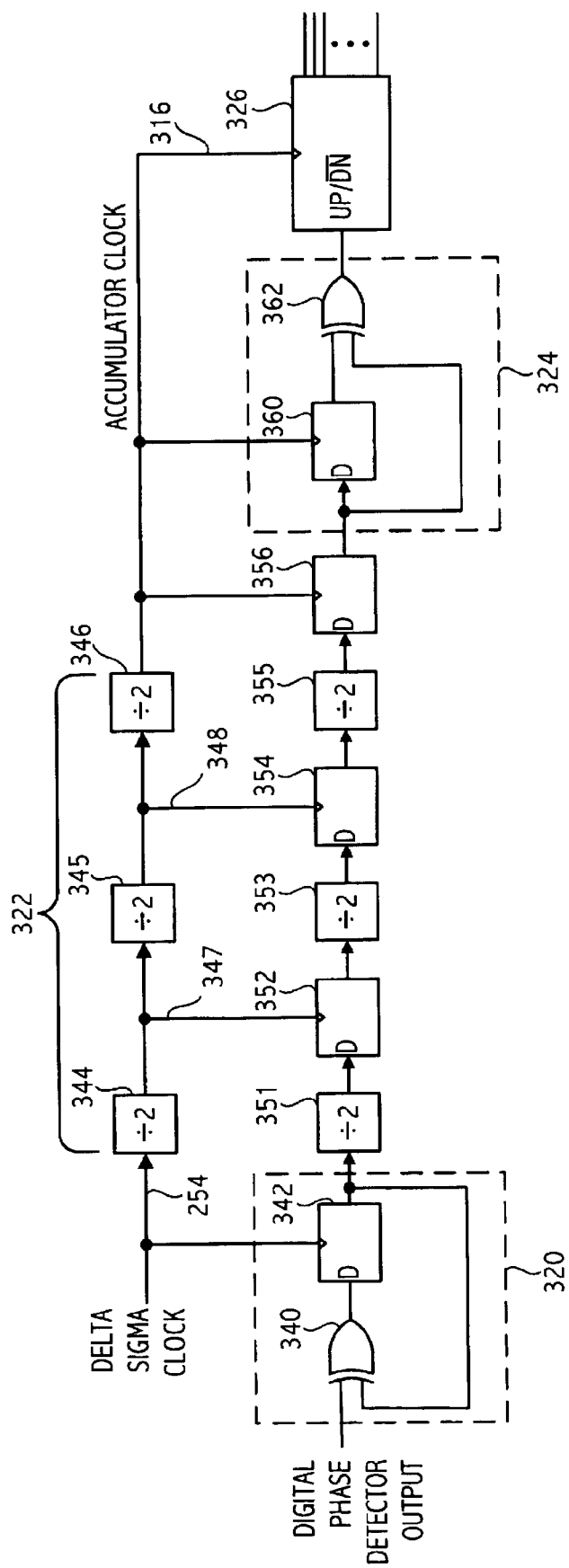
FIG. 13A is a schematic diagram of one embodiment of the decimation block shown in FIG. 12.

The decimation stage 312 shown in FIG. 12 may be implemented in a variety of ways. One suitable arrangement (implementing, for example, a divide-by-eight decimation stage) is shown in FIG. 13A. Here, the 1-to-transition converter 320 is implemented by an XOR gate 340 and a D-register 342 configured in a well-known arrangement, and clocked by the delta-sigma clock conveyed on node 254. Each stage of the divide-by-$2^N$ block 322 is implemented using a divide-by-two register (e.g., 351, 353, and 355) paired with a D-register (e.g., 352, 354, and 356). Such a divide-by-two register may be easily implemented by connecting a complement Q output signal to its own D input node, or similar structures. Each D-register is synchronized to a corresponding divided-down clock from the delta-sigma clock by a trio of registers 344, 345, and 346, each configured to divide by two. The transition-to-1 converter 324 is preferably implemented using a D-register 360 and an XOR gate 362 configured in a well-known arrangement, and clocked by the divided-down delta-sigma clock conveyed on node 316. This same divided-down clock signal preferably serves as the accumulator clock that, for this embodiment, is coupled to the up/down counter 326.

As can be appreciated from an inspection of FIG. 13A, very little circuitry operates at the relatively fast clock rate of the delta-sigma clock, and the circuitry that does operate at that rate is very simple and requires very few propagation delays between clock transitions. The ripple counter quickly lowers the clock rate of each succeeding stage so that the accumulator clock runs at the delta-sigma clock rate divided by $2^N$. For an exemplary embodiment using a 1.25 GHz delta-sigma clock and a divide-by-eight decimation stage, the accumulator clock preferably runs at only 155 MHz. At this modest speed, an up/down counter or other suitable digital accumulator structure may be designed using area and power efficient single-ended logic circuits (rather than fully differential circuits) and may be synthesized using commercially available logic synthesis tools. Consequently, as the value of N in the decimation stage increases, the power dissipation of the digital accumulator is reduced at the expense of lower resolution in the accumulator path. In an alternative structure, the digital integration block shown in FIG. 10 may include an up/down counter connected directly to the output signal from the delta-sigma modulator conveyed on node 222, which counter is clocked at the full delta-sigma clock rate. Such a structure is conceptually simpler but consumes additional power in operation. While integer divide ratios are likely preferred (e.g., divide-by-two per stage), other divide ratios of positive rational numbers (i.e., a ratio of integers) may also be provided.

Referring now to FIG. 13B, another embodiment suitable for use as a digital accumulator is shown (such as the digital accumulator 212 shown in FIG. 11, or such as the digital integrator 210 shown in FIG. 10). Digital accumulator 580 includes a least-significant-bit (LSB) accumulator 582, here shown as a 7-bit accumulator, and a most-significant-bit (MSB) accumulator 586, here shown as a 12-bit accumulator. An overflow/underflow block 584 is optionally included to generate an underflow and overflow signal (i.e., an increment and decrement signal) for the MSB accumulator 586. The increment/decrement signals may be generated to reflect an overflow/underflow condition from any of several bit positions within the LSB accumulator 582, thus providing for a variable width of the overall digital accumulator 580 as a function of a DATA_RATE_SELECT signal received by the overflow/underflow block 584. Lower data rates preferably select increasingly higher accumulator widths to satisfy jitter requirements of the PLL. For example, for a clock and data recovery embodiment described herein, the digital accumulator 580 width is preferably configured as 19 bits for OC-3 data rates (i.e., selecting bit 6 from the LSB accumulator to generate an overflow or underflow), while for OC-48 the width is preferably configured as 16 bits (i.e., selecting bit 3 from the LSB accumulator to generate an overflow or underflow). In other applications, the width of the digital accumulator may be fixed and the selectable overflow/underflow block 528 not used, resulting in a fixed decimation by the LSB accumulator 582 (and possibly decimated additionally by a separate preceding decimation stage). In one embodiment, the signals from each bit position of the LSB accumulator 582 are themselves an increment and a decrement signal, and the overflow/underflow block 584 may be a multiplexer circuit (and the INC/DEC input from the LSB accumulator not utilized. In another embodiment, the signal from each bit position of the LSB accumulator 582 may be a carry-out signal for the bit position, and the overflow/underflow block 584 utilizes the INC/DEC input from the LSB accumulator (as shown) to generate the increment/decrement signal for the MSB accumulator 586.

Preferably both accumulators 582 (if used) and 586 may be loaded with a value and/or "frozen" during calibration and test modes. For example, the accumulators are preferably loaded with a value at or near its mid-point value and frozen during calibration, and then released when attempting to acquire lock. To enhance testing capabilities, the accumulators are preferably loadable with an arbitrary value in a test mode.

Irrespective of the configured width of the digital accumulator 580, the output conveyed to the DAC, for this exemplary embodiment, remains as a 12-bit output from the MSB accumulator 586, which may be clocked using the same clock as for the LSB accumulator 582 (as shown), or may be clocked at a slower clock rate to save power. For example, the MSB accumulator 586 may be clocked at a constant rate that is lower than the clock rate for the LSB accumulator 582, or may vary in accordance with which output bit is selected by the multiplexer 584.

The accumulator 580 may be connected to the output of a separate decimation circuit, such as the decimation circuit 312 shown in FIG. 12, or may be connected directly to the output of a digital phase detector with the LSB accumulator 582 essentially functioning as a decimation circuit in its own right. In a broader sense, the digital accumulator may be bifurcated into a LSB-portion operating a clock rate, and a MSB portion operating at a lower clock rate than the LSB portion. The data bits of the LSB portion may be ignored by downstream circuitry, thus performing a decimation function by preserving the width of the digital accumulator but decreasing the output resolution of the accumulator. In an even broader sense, the digital accumulator may be segmented into more than two hierarchical sections, with higher order sections preferably (but not necessarily) operating at a lower clock rate than preceding sections. For example, each respective higher order sections may operate at a lower clock rate than the respective preceding section, although such is not necessarily required. In one embodiment, a cascaded series of 1-bit adders may implement a decimation circuit or a portion (or all) of a digital accumulator circuit. Some number of the lower order data bits (irrespective of which hierarchical section they reside) may be ignored by downstream circuitry, thus performing a decimation function by preserving the width of the digital accumulator but decreasing the output resolution of the accumulator. Alternatively, all the digital accumulator bits may be presented to and acted upon by downstream circuitry, thus performing no decimation function within the accumulator. Such a structure may be implemented with or without an additional decimation circuit coupled between the phase detector output and the digital accumulator input. In certain embodiments, a single digital accumulator may be configurable to different lengths, but whose output word is a variable length beginning with the least significant bit, to provide a variable dynamic range but with the same effective "capacitance" value. In any of these structures, any decimated bits form part of the digitally-accumulated word, and thus in a broad sense, a digital accumulator circuit may be thought of as potentially including, but certainly not requiring, a separate decimation circuit.

Referring again to FIG. 5, the D/A converter 214 may be implemented using any convenient structure, but preferably is implemented using a delta-sigma converter sampled at the accumulator clock rate. A delta-sigma D/A converter is advantageous here because of its high analog output voltage (i.e., conversion) accuracy, its small physical size, its ease of design and implementation, its low power, and the tolerance (within an integrating path synthesizing a low-pass filter) for a relatively slow conversion time. Such circuits are well known in the art, and a detailed description is unnecessary. The filter block 216 connected to the output of the D/A converter 214 may be any suitable filter structure, and may conveniently be an RC filter implemented using a modest-sized capacitor only a few tens of picofarads in size which need only be a low-Q capacitor (e.g., may be implemented using an MOS transistor gate capacitance).

Figure 13C:
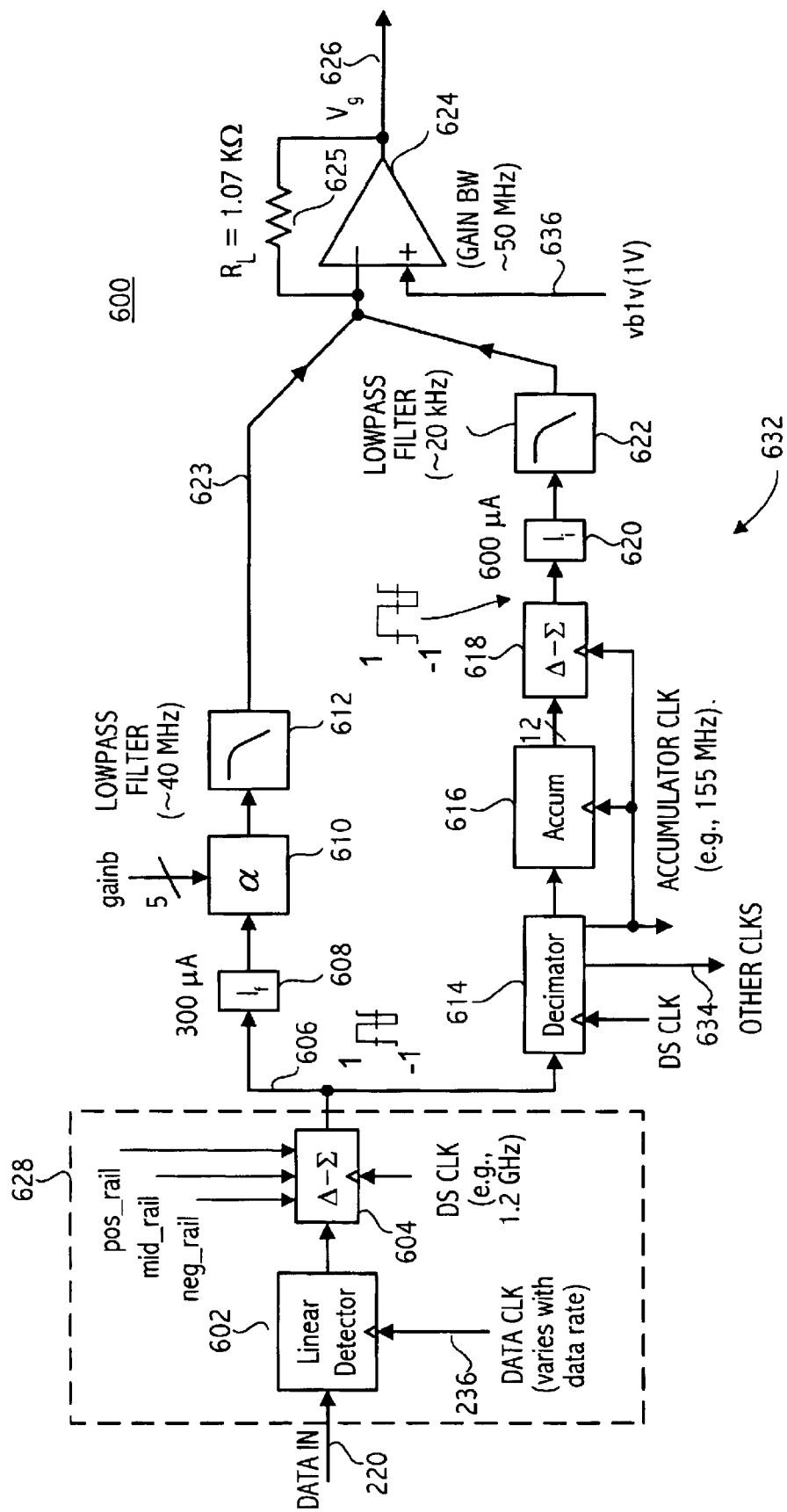
FIG. 13C is a block diagram of an exemplary portion of a PLL circuit including a digital phase detector and a digitally-synthesized loop filter capacitor in accordance with the present invention.

Referring now to FIG. 13C, a block diagram is shown of an exemplary portion of a PLL circuit including a digital phase detector and a digitally-synthesized loop filter capacitor, similar to that conceptually depicted in FIG. 5. The phase locked loop portion 600 includes a digital phase detector 628 which receives the input data signal conveyed on node 220 and a data rate clock signal conveyed on node 236. The digital phase detector 628 generates on its output node 606 an error signal which digitally encodes the phase difference between the input data signal and the data rate clock signal. In this embodiment the digital phase detector includes a linear phase detector 602 and a delta-sigma modulator 604. The digital phase detector 628 may also include additional circuitry to generate on an output node (not shown) the reconstructed output data.

The loop filter for this exemplary PLL portion 600 includes a feed forward path formed by a charge pump 608 responsive to the delta-sigma signal on node 606, followed by a configurable gain stage 610 and a low-pass filter block 612 having, for this embodiment, a preferred bandwidth of approximately 40 MHz. The configurable gain stage 610 is preferably a configurable current mirror which provides a gain which is selectable between about 0.5 to about 1.5. With a 5-bit digital word used to convey the desired gain, a configurable gain stage 610 is preferably configured so that the gain is equal to $(24+g_0 2^0+g_1 2^1+g_2 2^2+g_3 2^3+g_4 2^4)/40$.

The loop filter for this exemplary PLL portion 600 further includes a digital integrating block 632. The output signal of the feed forward path is combined with the output signal of the digital integrating block on a combined output node 623, which is converted by amplifier 624 and feedback resistor 625 to a voltage signal suitable for use as a control signal for a voltage controlled oscillator. A voltage reference conveyed on node 636 is preferably about one volt in magnitude and is preferably generated by an internal band-gap reference circuit.

The digital integrating block 632 includes a decimator block 614, a digital accumulator 616, a sigma-delta D/A converter 618, a charge pump 620, and a low-pass filter 622. The decimator 614 receives the digital phase error representation from the digital phase detector 628 and generates a decimated phase error signal, which is then integrated by the digital accumulator 616. The digital accumulator 616 preferably may be configured as in the accumulator 580 shown in FIG. 13B. The multiple-bit register within the accumulator 616 representing the integrated value of the phase error is preferably communicated on an N-bit wide output bus to the D/A converter 618 which, along with the charge pump 620, converts the digital representation into an analog signal which is then filtered by the low-pass filter 622 and combined with the feedforward path signal at node 623. The combined output is then converted to a voltage to form an analog control voltage on output node 626. The decimator 614 may be configured to generate the accumulator clock (e.g., a 155 MHz clock signal) as well as other low frequency clocks (conveyed on node(s) 634) which are useful and convenient for other portions of an integrated circuit. The MID_RAIL signal is preferably asserted to effectively "disconnect" the feedforward path during calibration.

Figure 14:
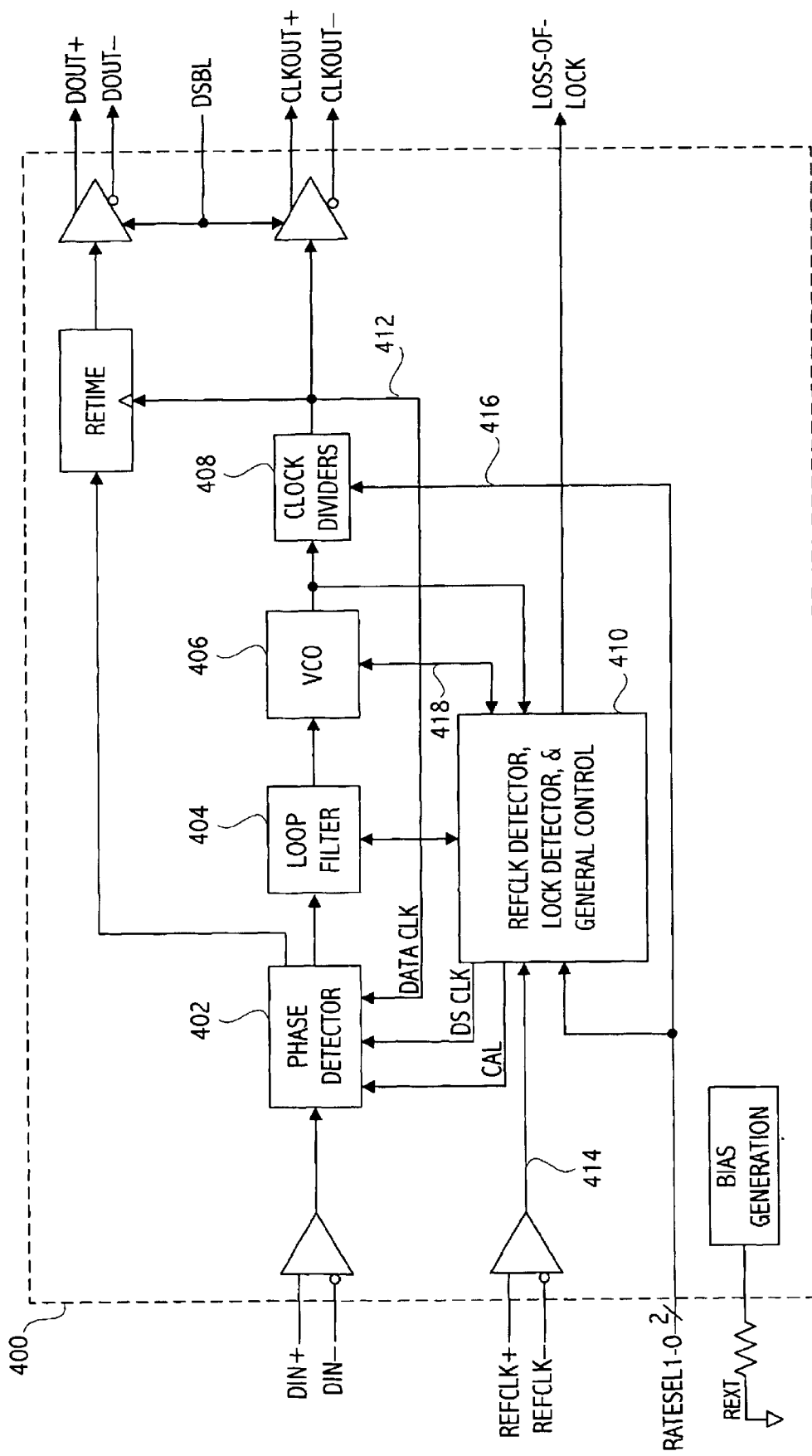
FIG. 14 is a block diagram of a clock and data recovery circuit incorporating the present invention, and for which the present invention is particularly advantageous.

Referring now to FIG. 14, a block diagram of an exemplary clock and data recovery circuit 400 is shown which advantageously incorporates the present invention. This exemplary clock and data recovery circuit 400 is preferably implemented as a single integrated circuit particularly well suited to operation with a SONET data stream. A differential input data signal is buffered and conveyed to a phase detector 402 along with a data rate clock signal conveyed on node 412. The phase error signal from the phase detector 402 is filtered by a loop filter 404, such as described above, to generate a first control signal for a VCO 406. A clock divider block 408 selectively divides the VCO clock signal in accordance with an externally-provided rate select signal communicated on node 416, to generate the data rate clock signal on node 412. An externally-provided reference clock signal REFCLK is buffered and conveyed on node 414 to a lock detector block 410, along with the rate select signal on node 416 and the VCO clock signal. The lock detector block 410 generates a LOSS-OF-LOCK signal (LOL) and also generates a second control signal for the VCO 406 (on node 418) to aid in frequency acquisition of the data recovery PLL. When the lock to data is lost, the clock and data recovery PLL is preferably tuned to the reference clock REFCLK instead. The VCO 406 is preferably an LC oscillator, although other types are also contemplated. Exemplary LC oscillators are described in U.S. Pat. No. 6,137,372 to Welland (which describes certain calibration capabilities of such an oscillator) which is hereby incorporated by reference, and further described in "Feedback System Incorporating Slow Digital Switching for Glitch-Free State Changes," by Rex T. Baird, et. al., U.S. Provisional Application No. 60/300,699, filed on Jun. 25, 2001, which application is hereby incorporated by reference. Other types of controlled oscillators, such as a current controlled oscillator with a suitable control signal, are also contemplated.

Other preferred circuits useful for implementing a phase locked loop circuit, and particularly suited for a clock and data recovery application, are described in the following U.S. patent applications, each of which is being filed on Jul. 10, 2001, and each of which is hereby incorporated by reference: "Digital Phase Detector Circuit and Method Therefor," by Perrott, U.S. patent application Ser. No. 09/902,542; and "Apparatus and Method for Decimating a Digital Input Signal," by Perrott, U.S. patent application Ser. No. 09/902,548.

An auto-detect block is preferably implemented within the lock detector block 410 to auto-detect which REFCLK frequency, of several possible frequencies, is received by the device, without requiring dedicated integrated circuit pins to so indicate. Alternatively, of course, dedicated external pins may be used to communicate the particular REFCLK frequency being used. In this exemplary circuit 400, the VCO 406 is configured to operate at a nominal frequency of 2.488 GHz when receiving an externally-provided REFCLK frequency of either 155.52, 77.76, or 19.44 MHz. In operation, the exact frequency of the VCO 406 adjusts to that of the incoming data signal. Depending upon which REFCLK frequency is detected, various dividers and logic gates are configured in the lock detector 410 to ensure that the VCO operates at a multiple of the REFCLK frequency necessary to generate a 2.488 GHz clock rate, as noted in Table 1 below. An exemplary auto-detection capability is described in "Integrated Circuit Incorporating Auto-Detection of an Externally-Provided Reference Clock Frequency and Method Therefor" by Michael H. Perrott, et al, U.S. patent application 09/902,543, filed on Jul. 10, 2001, and which is hereby incorporated by reference.

TABLE 1

| SONET/SDH | Bit Rate | Gigabit Ethernet | Ratio of VCO to REFCLK |
|---|---|---|---|
| 19.44 MHz | 19.53 MHz | 20.83 MHz | 128 |
| 77.76 MHz | 78.125 MHz | 83.31 MHz | 32 |
| 155.52 MHz | 156.25 MHz | 166.63 MHz | 16 |

The phase detector 402 is preferably implemented using a digital phase 202 shown in FIG. 6 incorporating a delta-sigma modulator. The data clock on node 412 to the phase detector 402 may be up to 2.5 GHz in frequency. The delta-sigma clock provided to the phase detector 402 is preferably generated at 1.25 GHz. The loop filter 404 preferably includes a digital integrating block as described above, which advantageously includes a $2^3$ decimator, such as decimator block 312, and advantageously includes a digital accumulator, such as digital accumulator 212, having at least 12 bits of resolution and clocked at a rate equal to the delta-sigma clock rate divided by the decimation factor (e.g., up to 155 MHz).

In an exemplary embodiment, a clock and data recovery integrated circuit is configured to operate at any of four general data rates, as recited in Table 2.

TABLE 2

| RATESEL [0:1] | SONET/SDH | Bit Rate | Gigabit Ethernet | OC48 with 15/14 FEC | Data CLK Divider |
|---|---|---|---|---|---|
| 00 | OC48 | 2.488 Gbps | — | 2.67 Gbps | 1 |
| 10 | — | 1.244 Gbps | 1.244 Gbps | — | 2 |
| 01 | OC12 | 622.08 Mbps | — | — | 4 |
| 11 | OC3 | 155.52 Mbps | — | — | 16 |

As used herein, a "clock signal" is not necessarily a well-shaped square wave with abrupt transitions, as is commonly assumed in modest-speed digital circuits. Rather, a clock signal need only be a periodic signal (or a gated periodic signal). Consequently, sawtooth waveforms, "sloppy" square waveforms, sinusoidal waveforms, triangular waveforms, and any other periodic waveform may be used as a clock signal. An externally-provided frequency reference signal may be a signal entirely generated off-chip and conveyed as an identifiable signal to the integrated circuit. Alternatively, such an externally-provided frequency reference signal may be provided by a resonant circuit coupled to the integrated circuit, such as a crystal, even though a portion of any required "oscillator" circuitry may be contained on-chip. Moreover, as used herein, the term "decimation" does not necessarily refer to a power of ten as its Latin name might imply, but is used, as is common in the art, to refer to any amount of discarding of an input signal in favor of keeping a remaining portion. A data interval is the period of a single data bit. A latching circuit may be a register or a latch as understood by one skilled in the art, and may be level sensitive or edge-triggered on its clock input. Many suitable latching circuits, both single-ended and differential, are well known in the art. As used herein, a digital accumulator circuit is intended to be afforded the broadest possible interpretation, to encompass a wide variety of circuits which may be employed to accomplish the desired function.

The invention is not contemplated to be limited to traditional silicon semiconductor technologies, as other suitable semiconductor technologies, such as gallium arsenide, silicon carbide, and indium phosphide may take advantage of the teachings herein.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, although a preferred analog (i.e., linear) phase detector is described, the invention is not limited to such a phase detector. Other configurations may be used and still enjoy the advantages described of using a digital integration block. For example, for certain applications a bang-bang phase detector (described above) may be employed. Moreover, the invention is not limited to use with a first-order delta-sigma modulator. Higher order delta-sigma modulators may be used. Moreover, other digital encoding schemes, requiring a modulator other than a delta-sigma modulator, may also be advantageously incorporated without departing from the spirit of the invention. Nor is the digital encoder used limited to a one-bit output modulator. For example, a multi-bit output delta-sigma modulator or other digital modulators or encoders may be used advantageously. The present invention is useful in many types of feedback systems and provides an improved way to achieve a long time constant without requiring a large, traditional capacitor. Accordingly, other embodiments, variations, and improvements not described herein are not necessarily excluded from the scope of the invention, which is defined by the following appended claims.

A particular advantage of using a digitally-synthesized loop filter as described herein within a phase locked loop circuit is reduced drift of the control signal for the oscillator within the loop, and consequently better frequency stability. Since the control signal is derived from a "filtered" value maintained in a digital accumulator rather than as an analog voltage on a node, a long string of transition-less bits causes much less drift on the control signal ultimately presented the controlled oscillator of the phase locked loop.

Even though the preferred embodiments are described in the context of a phase locked loop circuit arranged for clock and data recovery, it should be appreciated that such a circuit is not necessarily required unless specifically enumerated in a particular claim. The teachings of the present invention are believed advantageous for use with other types of circuits, such as a reference-less phase locked loop circuit. A loop filter feedforward path as described herein may also be implemented digitally using the teachings set forth herein. Moreover, in certain embodiments, the digital accumulator value may be directly used to control a VCO or other controlled circuit without being first converted to an analog signal. For example, a digitally-accumulated word (or portion thereof) may be used to control a plurality of slow-switched capacitor circuits for an LC oscillator, as described in "Feedback System Incorporating Slow Digital Switching for Glitch-Free State Changes," by Rex T. Baird, et. al., U.S. Provisional Application No. 60/300,699, filed on Jun. 25, 2001, and incorporated herein by reference. Moreover, for certain applications, such capacitor circuits could also be switched abruptly, particularly if system jitter specifications allow such changes. In an abstract sense, such VCO capacitor control circuits may be thought of as providing a D/A and filter operation for the digital accumulator circuit, particularly if the VCO incorporates slow switching.

Alternatively, an analog "current signal" may be provided rather than a voltage signal to control an oscillator or other controlled circuit. The control signal may take any of a variety of forms, depending on the circuit being controlled. Accordingly, other embodiments, variations, and improvements not described herein are not necessarily excluded from the scope of the invention, which is defined by the following appended claims.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., VCOs, RC filters, adder blocks, gain blocks, input/output buffers, etc.) are not specifically described, such circuits are well known, and no particular advantage is believed to be afforded by specific variations of such circuits in the context of practicing this invention. Moreover, it is believed that one of ordinary skill in the art, equipped with the teaching of this disclosure, will be able to carry out the invention, including implementing various other circuits not specifically described herein, using well known circuit techniques and without undue experimentation.

General Terminology

Regarding general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

As an additional example, a logic signal has an active level and an inactive level (at least for traditional binary logic signals) and the active and inactive levels are sometimes also respectively called active and inactive "states." The active level for some logic signals is a high level (i.e., an "active-high" signal) and for others is a low level (i.e., an "active-low" signal). A logic signal is "asserted" or "activated" when driven to the active level. Conversely, a logic signal is "de-asserted" or "de-activated" when driven to the inactive level. A high logic level is frequently referred to as a logic "1" and a low logic level is frequently referred to as a logic "0" (at least for positive logic).

Frequently logic signals are named in a fashion to convey which level is the active level. For example, CLKEN is commonly used to name an active-high clock enable signal, because the true polarity is implied in the name. Conversely, CLKENB, /CLKEN, CLKEN#, CLKEN*, CLKEN_L, CLKEN_C, or #CLKEN are commonly used to name an active-low clock enable signal, because one of the many common expressions indicating the complement polarity is used in the name. It is to be appreciated by those skilled in the art that these and other similar phrases may be used to name the signals and nodes. The schematic diagrams and accompanying description of the signals and nodes should in context be clear.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit. The term may appear either using subscripts (e.g., $V_{DD}$) or not.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit. Describing a circuit as functioning with a "VDD supply" and "ground" does not necessarily mean the circuit cannot function using other power supply potentials.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. Accordingly, other embodiments, variations, and improvements not described herein are not necessarily excluded from the scope of the invention, which is defined by the

What is claimed is:

1. In a phase locked loop system, a digitally-synthesized loop filter circuit comprising:

a first circuit for providing a digital representation of a phase error signal of the phase locked loop;

a second circuit responsive to the digital phase error signal, for generating a multi-bit accumulated digital phase error signal representing an accumulated value of successive values of the digital phase error signal; and a third circuit for generating an output signal corresponding to the accumulated digital phase error signal, said output signal useful for controlling an oscillator within the phase locked loop.

2. The invention defined by claim 1 wherein the first circuit comprises:

a digital phase detector circuit for the phase locked loop system.

3. The invention defined by claim 2 wherein the digital phase error signal comprises:

a quantized-time and quantized-value signal which encodes polarity of phase error.

4. The invention defined by claim 2 wherein the digital phase error signal comprises:

a quantized-time and quantized-value signal which linearly encodes phase error.

5. The invention defined by claim 1 wherein the first circuit comprises:

an analog-to-digital converter circuit for converting an analog representation of a phase error signal into a corresponding digital representation.

6. The invention defined by claim 5 wherein the first circuit comprises:

a delta-sigma encoder circuit having a clock input coupled to receive a first clock signal.

7. The invention defined by claim 1 wherein the second circuit comprises:

a digital accumulator circuit for accumulating successive values of a digital input signal representing the phase error, and for providing on an output thereof a multi-bit accumulated digital phase error signal.

8. The invention defined by claim 7 wherein the digital accumulator circuit comprises:

an accumulator circuit for conveying the multi-bit accumulated digital phase error signal having a variable number of bits beginning with the least significant bit.

9. The invention defined by claim 7 wherein the digital accumulator circuit comprises:

a lower-order accumulator circuit having an input responsive to the digital input signal representing the phase error, and having at least one output; and an upper-order accumulator circuit having an input coupled to an output of the lower-order accumulator circuit, and having an output for conveying a portion of the multi-bit accumulated digital phase error signal;

wherein both the lower-order accumulator circuit and the upper-order accumulator circuit together compute the multi-bit accumulated digital phase error signal.

10. The invention defined by claim 9 wherein:

the upper-order accumulator circuit is clocked at a lower rate than the lower-order accumulator circuit is clocked.

11. The invention defined by claim 9 wherein:

of the upper-order and lower-order accumulator bits forming the accumulated digital phase error signal, only a portion of the bits are conveyed to the third circuit.

12. The invention defined by claim 11 wherein:

of the upper-order and lower-order accumulator bits forming the accumulated digital phase error signal, only upper-order accumulator bits are conveyed to the third circuit.

13. The invention defined by claim 7 wherein:

the digital phase error signal from the first circuit is coupled to the digital accumulator circuit as the digital input signal.

14. The invention defined by claim 13 wherein the second circuit comprises:

a digital accumulator circuit having an input coupled to receive the digital phase error signal, having a clock input coupled to receive an accumulator clock signal, and having an output for conveying a multi-bit output signal representing an accumulated value of successive values of the digital phase error signal.

15. The invention defined by claim 7 wherein:

the digital input signal for the digital accumulator circuit is derived from the digital phase error signal received from the first circuit.

16. The invention defined by claim 15 wherein the second circuit further comprises:

a decimator circuit responsive to the digital phase error signal, for generating a decimated digital phase error signal which is coupled to the accumulator circuit as the digital input signal.

17. The invention defined by claim 1 wherein:

the output signal comprises an analog representation of at least a most-significant-bit portion of the accumulated digital phase error signal.

18. The invention defined by claim 1 wherein:

the multi-bit accumulated digital phase error signal is computed to a greater number of bits than is conveyed to the third circuit.

19. The invention defined by claim 1 wherein the third circuit comprises:

a digital-to-analog converter circuit.

20. The invention defined by claim 19 wherein the third circuit further comprises:

a low-pass filter circuit connected to an output of the digital-to-analog converter circuit.

21. The invention defined by claim 1 wherein:

an effective value of capacitance provided by the digitally-synthesized loop filter circuit increases with increasing numbers of bits in the accumulated digital phase error signal.

22. The invention defined by claim 21 wherein:

the number of bits in the accumulated digital phase error signal is configurable.

23. The invention defined by claim 22 wherein:

the number of bits in the accumulated digital phase error signal is configurable to alter an operating characteristic of the phase locked loop system.

24. The invention defined by claim 1 wherein:

the loop filter circuit is implemented entirely within an integrated circuit.

25. The invention defined by claim 1 wherein:

the loop filter is implemented entirely within an integrated circuit configured to recover clock and data from an incoming data signal having more than one possible data rate; and the number of bits in the accumulated digital phase error signal is configurable based upon the data rate of the incoming data input signal.

26. The invention defined by claim 1 wherein:

the first circuit comprises a digital encoder circuit forming a portion of a phase detector circuit for the phase locked loop system, said digital encoder circuit having a clock input coupled to receive a first clock signal.

27. The invention defined by claim 26 wherein the second circuit comprises:

a decimator circuit responsive to the digital phase error signal from the first circuit, for generating a decimated digital phase error signal having a lower data rate than the digital phase error signal; and a digital accumulator circuit for accumulating successive values of the decimated phase error signal, having a clock input coupled to receive a second clock signal having a clock rate lower than that of the first clock signal, and for providing on an output thereof at least a most-significant-bit portion of the multi-bit accumulated digital phase error signal.

28. The invention defined by claim 27 wherein the third circuit comprises:

a digital-to-analog converter circuit having an input responsive to at least the most-significant-bit portion of the multi-bit accumulated digital phase error signal, and having an output; and a filter having an input connected to the output of the digital-to-analog converter circuit, and having an output for providing the output signal corresponding to the accumulated digital phase error signal.

* * * * *

UNITED STATES PATENT AND TRADEMARK OFFICE
CERTIFICATE OF CORRECTION

PATENT NO. : 6,765,445 B2
DATED : July 20, 2004
INVENTOR(S) : Michael H. Perrot, Rex T. Baird and Yunteng Huang It is certified that error appears in the above-identified patent and that said Letters Patent is hereby corrected as shown below:

<u>Column 19,</u>
Line 2, the words "a digital phase" should read -- a digital phase detector --.

Signed and Sealed this

First Day of February, 2005

JON W. DUDAS
*Director of the United States Patent and Trademark Office*